United States Patent [19]
Uno et al.

[11] Patent Number: 5,106,824
[45] Date of Patent: Apr. 21, 1992

[54] METHOD OF MANUFACTURING OXIDE SUPERCONDUCTOR AND THE PRECURSOR OF THE OXIDE SUPERCONDUCTOR COMPRISING HEAT TREATING IN A REDUCING ATMOSPHERE OF EITHER HYDROGEN OR CARBON MONOXIDE UNDER REDUCED PRESSURE

[75] Inventors: Naoki Uno; Noritsugu Enomoto; Yasuzo Tanaka, all of Yokohama; Shoji Shiga, Utsunomiya, all of Japan

[73] Assignee: The Furukawa Electric Co., Ltd., Tokyo, Japan

[21] Appl. No.: 544,026

[22] Filed: Jun. 27, 1990

Related U.S. Application Data

[63] Continuation of Ser. No. 226,938, Aug. 1, 1988, abandoned.

[30] Foreign Application Priority Data

| Aug. 10, 1987 | [JP] | Japan | 62-199470 |
| Aug. 12, 1987 | [JP] | Japan | 62-201524 |
| Aug. 13, 1987 | [JP] | Japan | 62-202415 |
| Nov. 20, 1987 | [JP] | Japan | 62-293758 |
| Dec. 1, 1987 | [JP] | Japan | 62-304261 |
| Feb. 24, 1988 | [JP] | Japan | 63-41750 |
| Apr. 6, 1988 | [JP] | Japan | 63-84827 |
| Apr. 6, 1988 | [JP] | Japan | 63-84828 |
| Apr. 6, 1988 | [JP] | Japan | 63-84829 |
| Apr. 6, 1988 | [JP] | Japan | 63-84830 |
| Apr. 27, 1988 | [JP] | Japan | 63-105027 |

[51] Int. Cl.$^5$ ............................................. H01B 12/00
[52] U.S. Cl. .................................. 505/1; 505/725; 505/778; 423/130; 501/123
[58] Field of Search ................. 505/1, 725, 778; 423/130; 501/123

[56] References Cited

U.S. PATENT DOCUMENTS

| 2,180,220 | 11/1939 | Boyd | 423/130 |
| 2,769,687 | 11/1956 | Porter et al. | 423/130 |
| 4,409,020 | 10/1983 | Holman, Jr. et al. | 423/130 |

FOREIGN PATENT DOCUMENTS

| 0335920 | 2/1978 | U.S.S.R. | 423/130 |

OTHER PUBLICATIONS

Ganguly et al., "Superconductivity in La-Sr-(Ba)—Cu—O and Related Systems", *Solid State Comm.* vol. 62(12) Apr. 1987, pp. 807-809.
Kishio et al., "Effect of Residual Water on Superconductivity in . . . ", *Jap. Jnl of App. Phys.*, vol. 26(4), Apr., pp. L466-L467.
Michel, "Oxygen Intercalation in Mixed Valence Copper . . . ", *Revuew de Chimie Minerale*, c. 21, 1984, pp. 407-425.
Chu, "Evidence for Superconductivity Above 40 K in the La-Ba-. . . ", *Phys. Review Lett.*, vol. 58(4), Jan. 26, 1987, pp. 405-407.
Wu, "Superconductivity at 93K in a New Mixed . . . ", *Phys. Rev. Lett*, vol. 58(9), Mar. 2, 1988, pp. 908-910.
Politis, "Superconductivity at 40K in $La_{1.8}Sr_{0.2}CuO_4$", *Z. Phys. B.-Condensed Matter-66*, Jun. 1987 (received), pp. 141-146.
Capone, "Super Critical Fields and High Superconducting Transition . . . ", *Appl. Phys. Lett.* 50(9), Mar. 2, 1987, pp. 543-544.
Bednorz, "Possible High Tc Superconductivity in the Ba-la-Cu-O", *Z. Phys. B—Condensed Matter—64*, Apr. 1987, pp. 189-193.
Tarascon, "Processing and Superconducting Properties of Perovskite", *Advanced Ceramic Matil*, vol. 2, No. 3B, Mar. 1987, pp. 498-504.
Shamoto, "Effect of Vacuum Annealing on the Superconductivity . . . ", *Jnp. Jnl. of App. Phys*, vol. 26 (4), Apr. 1987, pp. 493-494.
Chu, "Superconductivity of 52.5K in the Lanthanum-Barium . . . ", *Science*, Jan. 30, 1987.
Ishizawa, "Suerpconducting Properties of Highly Oxidized . . . $Ba_{2-x}Y_{1+x}Cu_3O$", *Jpn. J. Appl. Phys. Part 2*, vol. 26(5), May 1987, p. L676-L677 (abstract).
Kithio, "Determination of Oxygen Nonstoichiometry in . . . $Ba_2YCu_3O_7$", *Jpn. J. Appl. Phys.*, part 2, vol. 26(7), Jul. 1987, pp. L1228-1230 (Abstract).
Behrman, "Synthesis, Characterization and Fabrication of High Temp. Super . . . ", *Adv. Ceram. Mater.*, vol. 2, No. 3B, Jul. 1987, pp. 539-555 (abstract).
O'Bryan, "Characterization of $Ba_2YCu_3O$ as a Function of Oxygen . . . ", *Adv. Ceram. Mater.*, vol. 2, No. 3B, Jul. 1987, pp. 640-648 (abstract).
Marezio, "Relations Between Preparation Conditions, . . . $Ba_2YCu_3O_7$", *Proceedings: Comm. of Eur. Communities European Workshop on High Tc Superconductor and Potential Applications*, Jul. 1-3, 1987, pp. 59-60 (abstract).

(List continued on next page.)

*Primary Examiner*—Paul Lieberman
*Assistant Examiner*—Bradley A. Swope
*Attorney, Agent, or Firm*—Frishauf, Holtz, Goodman & Woodward

[57] ABSTRACT

Disclosed is a method of manufacturing an oxide superconductor containing at least an alkaline earth metal and copper. This method comprises the steps of heating a material substance containing elements constituting the oxide superconductor, in an atmosphere having an oxygen partial pressure of at most 50 Torr at a temperature ranging from 500° C. to 1000° C., and then heating the material substance in an oxygen-containing atmosphere. Also disclosed herein is a method of manufacturing composite oxide powder which is the precursor of the oxide superconductor. This method comprises the steps of heating the material substance in an atmosphere having an oxygen partial pressure of at most 50 Torr at a temperature ranging from 500° C. to 1000° C., and crushing the material substance into powder.

12 Claims, No Drawings

OTHER PUBLICATIONS

Hauck, "Oxygen Content Superconducting $Ba_2YCu_3O_{6.5+x}$", *Z. Phys. B*, vol. 67(3), Aug. 1987, pp. 299-302 (abstract).

Fukunaga, "Synthesis of a Superconducting Perovskite-Like Phase . . . ", *J. Cer. Soc. Jpn.*, vol. 95(6), 1987, pp. 663-665 (abstract).

Chevalier, "Superconductivity of $Y_{1-x}La_xBa_2Cu_3O_4$ System Prepard in Air", *Jnl. de Physique* 48(10), 1987, pp. 1619-1622 (abstract).

Eatough, "Orthorhombic-Tetragonal Phase Transition in High-Temp. . . . $YBa_2Cu_3O_x$", *Appl. Phys. Lett*, vol. 51(5), Aug. 3, 1987, pp. 367-368 (abstract).

Furukawa Review, No. 83, Dec. 1988, pp. 1-6 (partial translation is also enclosed).

Japanese Journal of Applied Physics, vol. 27, No. 6, Jun. 1988, pp. L1003-L1106.

Japanese Journal of Applied Physics, vol. 27, No. 6, Jun. 1988, pp. L1013-L1014.

Physical Review Letters, vol. 58, No. 4, Jan. 26, 1987, pp. 495-407; C. W. Chu et al.: "Evidence for Superconductivity above 40 K in the La-Ba-Cu-O Compound System", p. 405, left-hand column, line 8 from bottom-right-hand column, line 5.

Japanese Journal of Applied Physics, vol. 26, No. 4, Apr. 1987, pp. L510-L511; N. Terada et al.: "Lattice Parameter and Its Pressure Dependence of High $SrxLa2-xCuO4-y$ (x-0.6) Prepared Under Reducing Condition", whole document.

Advanced Ceramic Materials—Ceramic Superconductors, vol. 2, No. 3B, Jul. 1987, pp. 388-400; R. W. McCallum et al.: "Problems in the Production of $YBa2-Cu2Ox$ Superconducting Wire", p. 289.

METHOD OF MANUFACTURING OXIDE SUPERCONDUCTOR AND THE PRECURSOR OF THE OXIDE SUPERCONDUCTOR COMPRISING HEAT TREATING IN A REDUCING ATMOSPHERE OF EITHER HYDROGEN OR CARBON MONOXIDE UNDER REDUCED PRESSURE

This application is a Continuation of application Ser. No. 07/226,938, filed Aug. 1, 1988, now abandoned.

BACKGROUND OF THE INVENTION

1 Field of the Invention

The present invention relates to a method of manufacturing oxide superconductors having good superconducting properties, and also to a method of manufacturing composite oxide powder, i.e., a precursor from which the oxide superconductor having good superconducting properties can be manufactured easily.

2. Description of the Related Art

In recent years, various oxide superconductors have been found which comprise oxygen and other elements such as alkaline earth metals, rare earth elements, copper, bismuth, and thallium. These oxide superconductors are made in the following way. First, the material compounds, i.e., oxides of these elements, carbonates thereof, nitrates thereof, and a salt of organic acid of these elements such as acetate thereof or oxalate thereof are mixed in a specific ratio, thus forming a mixture powder. Then, the mixture powder is preburnt in the atmosphere or in an oxygen atmosphere, thus preparing a mass of composite oxide. The mass is crushed into powders. The powders are classified. The powders having diameters falling within a specific range, are used as composite oxide powder. The composite oxide powder is molded, thereby forming moldings of a desired shape. These moldings are first sintered and then burned in the atmosphere or in an oxygen atmosphere, thus forming oxide superconductors.

There is known another method of manufacturing oxide superconductors. In this method, a sol, gel, melt or solution, and the like, each containing the above-mentioned material compounds, are mixed, thus forming a composite oxide. This composite oxide is molded into moldings of a desired shape. These moldings are first sintered and then burnt in the atmosphere or in an oxygen atmosphere, thereby forming oxide superconductors.

The oxide superconductors made by sintering the moldings in the atmosphere are sufficiently dense, but do not have good superconducting properties since the composition and structure of the composite oxide powder has altered during the sintering due to the decrease of oxygen. On the other hand, the oxide superconductors made by sintering the moldings in the oxygen atmosphere have sufficient superconducting properties since the composition and structure of the composite oxide powder has changed only a little during the sintering, but are not sufficiently dense because the moldings have not been sintered completely. In particular, when the superconductors have been made in the form of rings, coils or the like, they are likely to have cracks, and fails to exhibit sufficient superconducting properties.

As has been pointed out, the moldings are first sintered and then burnt in either conventional method. Consequently, the resultant superconductors exhibit only insufficient superconducting properties such as critical current density (Jc).

Hitherto, the material compounds containing the elements constituting an oxide superconductor are mixed by means of the commonly used mechanical stirring. The mechanical stirring results in a material mixture of low homogeneity. Because of its low homogeneity, the material mixture can not sufficiently be changed into a desirable composite oxide powder, i.e., a precursor of an oxide superconductor, when the mixture is subjected to preburning.

Furthermore, when a salt containing carbon, such as $BaCO_3$, is used as one of the material compounds, the composite oxide will contain carbon residue. When the carbon remains in an amount over 0.1 wt %, it forms a low-melting point compound during the preburning or the sintering. This compound is deposited in the crystal boundaries. As a consequence, the preburnt or sintered mass fails to have a single homogeneous phase, which is an indispensable superconducting property. In this way, the carbon residue hinders the manufacture of oxide superconductors having sufficient superconducting properties such as critical current density (Jc).

SUMMARY OF THE INVENTION

It is accordingly the object of the present invention to provide a method of manufacturing an oxide superconductor which has good superconducting properties, and also a method of manufacturing composite oxide powder which is the precursor of the oxide superconductor.

According to one aspect of the present invention, there is provided a method of manufacturing an oxide superconductor containing at least an alkaline earth metal and copper, said method comprising the steps of: heating a material substance containing elements forming the oxide superconductor, in an atmosphere having an oxygen partial pressure of at most 50 Torr ($Po_2 \leq \leq 50$ Torr) at a temperature ranging from 500° C. to 1000° C.; and then heating the material substance in an oxygen-containing atmosphere.

According to another aspect of the present invention, there is provided a method of manufacturing composite oxide powder which is the precursor of the oxide superconductor, said method comprising the steps of: heating a material substance containing elements constituting the oxide superconductor containing at least an alkaline earth metal and copper, in an atmosphere having an oxygen partial pressure of at most 50 Torr at a temperature ranging from 500° C. to 1000° C.; and crushing the material substance, thereby forming composite oxide powder.

DETAILED DESCRIPTION OF THE PREFERRED EMBODIMENTS

The term "oxide superconductor containing at least an alkaline earth metal and copper" as is used herein generally means both an oxide superconductor comprising alkaline earth metals, rare earth elements, copper, and oxygen, and an oxide superconductor containing the same components except that at least one of the components is replaced by bismuth and thallium. More specifically, the term encompasses superconductors such as $ReBa_2Cu_3O_{7-x}$ including $YBaCu_3O_{7-x}$, $SmBa_2Cu_3O_{7-x}$, $ErBa_2Cu_3O_{7-x}$, $GdBa_2Cu_3O_{7-x}$, $DyBa_2Cu_3O_{7-x}$, $HoBa_2Cu_3O_{7-x}$, and $TmBa_2Cu_3O_{7-x}$; $(Re_{1-x}Re_x)Ba_2Cu_3O_{7-y}$ including $(Y_{1-x}D_{yx})Ba_2Cu_3O_{7-y}$, $(Y_{1-x}Er_x)Ba_2Cu_3O_{7-y}$, $Dy_{0.5}Ho_{0.5}Ba_2Cu_3O_{7-y}$; Bi-Sr-Ca-Cu$_2$-O$_x$ including $BiSrCaCu_2O_x$ and $Br_4Sr_2Ca_2Cu_4O_x$; and Tl2Ba2Ca2Cu3O7 (Re is a rare earth element other than La).

Further, the term "oxide superconductor" also means moldings made exclusively of the above-defined oxide superconductor substance, in the form of powder, strips, plates, pellets, coils, rings, pipes, and moldings having stabilizing metal layers formed on the outer surfaces. The oxide superconductor according to the present invention is limited to one which has critical temperature (Tc) equal to or higher than the temperature (77K) of liquid nitrogen. This is because, when its Tc is lower than the temperature of liquid nitrogen, the oxide superconductor will need to be cooled with liquid helium, as the conventional method, and will become less useful practically.

In the method according to the first aspect of the present invention, said material substance is preburnt or sintered in an atmosphere having an oxygen partial pressure of at most 50 Torr at a temperature ranging from 500° C. to 1000° C. The preburnt or sintered substance is then crushed, thus forming composite oxide powder which contains less oxygen than required to have such composition and such structure as will exhibit superconducting properties. If necessary, the composite oxide powder is molded into moldings having a desired shape. Then, either before or after crushing or molding, the composite oxide powder is heated in an oxygen-containing atmosphere, and is thus burnt, causing an oxygen-reaction sintering, thereby preparing powder or a dense moldings having a density of 95% or more of the theoretical density, either having such composition and structure as will exhibit superconducting properties. The composite oxide powder or the sintered moldings, thus obtained, is burnt in an oxygen atmosphere.

When the material substance is preburnt in an atmosphere having an oxygen partial pressure exceeding 50 Torr, the substance does not sufficiently lack in oxygen. The preburnt substance insufficiently lacking in oxygen cannot become a sufficiently dense after it has been burnt in the oxygen atmosphere. Hence, it is desirable that the material substance be preburnt in an atmosphere having an oxygen partial pressure of 50 Torr or less.

When the material substance is preburnt at a temperature over 1000° C., the components of the substance are melted, whereby the composite oxide powder or the moldings formed of this powder fail to have such composition and structure as will exhibit superconducting properties. On the other hand, when the material substance is preburnt at a temperature below 500° C., the reaction does not fully proceed. Therefore, it is advisable that the material substance be preburnt at a temperature ranging from 500° C. to 1000° C.

Even if the material substance is preburnt in an atmosphere whose oxygen partial pressure is 50 Torr or less, the substance containing carbon will not be completely decomposed if the total pressure of the atmosphere exceeds 0.5 atm due to Ar or N2 gas contained in the atmosphere. In view of this, it is desirable that the atmosphere ($P_{O_2} = \leq 50$ Torr) have a total pressure of 0.5 atm or less.

The material substance used in the present invention, which contains the elements constituting an oxide superconductor containing at least an alkaline earth metal and copper, is at least one selected from the group consisting of: oxide, hydroxide, halogenide of said elements; salts of inorganic acid of said elements such as carbonate thereof and nitrate thereof; salts of organic acid of said elements such as acetate thereof and oxalate thereof; alkoxide of said elements; and superconductor obtained by means of burning performed in the ordinary atmosphere or an oxygen atmosphere.

According to the first aspect of the present invention, the material substance can be used in the form of powder, a melt, a solution, a sol, or a gel.

The material substance is prepared in the following way. The salts containing the elements constituting the oxide superconductor are simultaneously precipitated by means of co-precipitation with oxalic acid, thereby forming powder. This powder is fine, and its components are uniformly dispersed. This powder is preferred since the reaction proceeds quickly and completely when the powder is preburnt, sintered or burnt.

When oxalate or the like, which is a salt containing carbon, is used as the material substance, the mixture powder contains carbon residue. Nonetheless, according to the first aspect of this invention, the carbon residue will be reduced to 0.1 wt % or less due to the decomposition occurring during the preburning step. More precisely, even if the material substance contains 0.1 wt % or more of carbon, the carbon will be decomposed, and its content will decrease to 0.1 wt % or less, when the substance is preburnt or sintered in an atmosphere ($P_{O_2} = \leq 50$ Torr) which has been evacuated to a total pressure of 0.5 atm or less. Such a low content of carbon is not detrimental at all to the superconducting properties of the final product.

Certainly, it is preferable that oxide, hydroxide, halogenide, nitrate or sulfate, which is a salt containing no carbon, be used as the material substance. When a salt of organic acid, such as carbonate, oxalate or acetate, which is a salt containing carbon, is used as the material substance, it is desirable that this salt be processed to decrease the carbon content to 0.1 wt % or less, thus preparing a mixture powder. The mixture powder can be actively sintered due to the reduced carbon content, thus forming oxide superconductors exhibiting excellent superconducting properties.

In the case of oxalate prepared by means of co-precipitation, its carbon residue is decomposed to reduce the carbon content, in the following way. The oxalate is preburnt at 500° C. to 1000° C. in an atmosphere having an oxygen partial pressure of 50 Torr or less. This method successfully reduces the carbon content to 0.1 wt % or less.

When the oxalate is preburnt in an atmosphere having an oxygen partial pressure over 50 Torr, the carbon residue cannot volatilize completely from the material substance.

When the oxalate is preburnt at a temperature lower than 500° C., the oxalate cannot be fully decomposed. On the other hand, when the oxalate is preburnt at a temperature higher than 1000° C., part of the oxalate will be melted. In either case, the final product will not exhibit sufficient superconducting properties.

According to the first aspect of the present invention, the material substance can be preburnt or sintered in an atmosphere containing an inert gas such as N2, Ar or He gas, as well as an oxygen atmosphere. Also in this case, the same advantage will be achieved.

As has been described, the second aspect of the invention is a method of manufacturing composite oxide powder which is the precursor of an oxide superconductor having a high critical current density (Jc).

The inventors of this invention have repeated experiments, and found the following facts about the conventional method:

(1) A carbonate such as $BaCO_3$, which is commonly used as materials compound in producing an oxide superconductor by the solid phase method, contains much carbon residue. The coprecipitate, which is generally used as material compound in making an oxide superconductor by the liquid phase method, also contains much carbon residue. When either material compound is sintered, the carbon residue aggregates at the crystal boundaries, inevitably degrading the superconducting properties of the final product, in particular the critical current density (Jc).

(2) The material compound, such as a carbonate, is preburnt at a relatively high temperature (about 950° C.) so as to accelerate the decomposition of the compound and the composite reaction thereof. Intermediate compounds having a low melting point are likely to be formed during the preburning of the material compound. These are impurities, and the final product cannot have a homogeneous phase and fails to exhibit sufficient superconducting properties such as critical current density (Jc).

The present invention has been made on the basis of these facts.

As has been stated, the second aspect of the present invention is a method of manufacturing composite oxide powder, in which a material substance containing elements constituting the oxide superconductor containing at least the alkaline earth metal and copper, is heated in an atmosphere having an oxygen partial pressure of at most 50 Torr at a temperature ranging from 500° C. to 1000° C.; and the material substance is then crushed, thereby forming composite oxide powder, i.e., the precursor of an oxide superconductor.

The composite oxide powder prepared by the method according to the present invention is oxygen-lacking and is, therefore, very active. When a moldings of a desired shape, made of this powder are sintered, it undergoes a kind of oxygen-reaction sintering. The sintered moldings are dense and has such a most suitable composition and structure as will exhibit superconducting properties.

Moreover, the composite oxide powder prepared by the method according to the present invention has a low carbon content of 0.1 wt % or less. Hence, when the powder is heat-treated in an oxygen-containing atmosphere, an oxide superconductor having excellent superconducting properties will be manufactured.

In order to manufacture composite oxide powder whose carbon content is 0.1 wt % or less, the material substance must be preburnt at a temperature ranging from 500° C. to 1000° C. in an atmosphere having a total pressure of 0.5 atm or less and an oxygen partial pressure of 50 Torr or less, preferably 5 Torr or less. If the preburning temperature is below 500° C., the material substance cannot be completely preburnt. On the other hand, if the preburning temperature exceeds 1000° C., a different phase of, for example, CuO will be precipitated to degrade the superconducting properties. If the material substance is preburnt in an atmosphere whose total pressure is higher than 0.5 atm and whose oxygen partial pressure is higher than 50 Torr, the carbon residue cannot be decomposed sufficiently, making it difficult to prepare composite oxide powder whose carbon content is 0.1 wt % or less.

According to the second aspect of this invention, composite oxide powder which has such composition and structure as will exhibit better superconducting properties can be manufactured by preburning the material substance twice. The primary preburning is performed in an atmosphere evacuated to a low oxygen partial pressure, thus decomposing the carbon residue and forming an active composite oxide which is oxygen-lacking too much to have such composition or such structure as will exhibit superconducting properties. The secondary preburning is carried out in an oxygen-containing atmosphere, thus changing the composite oxide to a composite oxide which has such a most suitable composition and structure as will exhibit superconducting properties.

It is necessary to conduct the primary preburning in an atmosphere whose total pressure is 0.5 atm or less and whose oxygen partial pressure is 50 Torr or less. If the total pressure and oxygen partial pressure of the atmosphere exceed 0.5 atm and 50 Torr, respectively, the carbon residue cannot be decomposed completely, rendering it difficult to provide composite oxide powder having a carbon content of 0.1 wt % or less. It is more desirable that the oxygen partial pressure be 5 Torr or less.

It is necessary to conduct the secondary preburning in an atmosphere whose oxygen partial pressure is 50 Torr or more. If the oxygen partial pressure of the atmosphere is below 50 Torr, the active, oxygen-lacking composite oxide obtained by means of the primary preburning can hardly be changed to composite oxide powder which has such a most suitable composition and structure as will exhibit superconducting properties.

Neither the primary preburning reaction nor the secondary preburning reaction proceeds if the temperature is less than 500° C. If the preburning temperature exceeds 1000° C., however, an different phase of, for example, $BaCuO_2$ or CuO will be precipitated to degrade the superconducting properties. Hence, it is necessary to perform both preburning at a temperature ranging from 500° C. to 1000° C. Particularly, it is desirable that the secondary preburning be effected at 700° C. to 900° C.

To prepare composite oxide powder which contains 0.1 wt % or less of carbon and a small amount of oxygen, the material substance can be preburnt in a reducing atmosphere at a temperature ranging from 500° C. to 1000° C. Hydrogen or carbon monoxide (CO) gas can be used as the reducing gas. When the partial pressure of either reducing gas is less than 0.1 Torr, the material substance can not be reduced sufficiently, making it hard to form composite oxide powder which contains 0.1 wt % or less of carbon and a small amount of oxygen. Therefore, it is required that the partial pressure of the reducing gas be 0.1 Torr or more. When the material substance is preburnt at a temperature lower than 500° C., it can be neither decomposed nor reduced sufficiently, and the resultant composite oxide powder can neither have a sufficiently low carbon content nor a small amount of oxygen. On the other hand, when the material substance is preburnt at a temperature higher than 1000° C., a different phase of, for example, CuO will be precipitated to degrade the superconducting properties. Hence, it is required that the material substance be preburnt at a temperature ranging from 500° C. to 1000° C.

As has been described, according to the second aspect of the present invention, various materials are preburnt, thereby preparing composite oxide powder. Even when organic acid salts such as carbonate, acetate, and oxalate are preburnt, there will be provided composite oxide powder whose carbon content is 0.1 wt % or less. Nonetheless, it is, of course, preferable that one or more material substances selected from the group consisting of oxide, hydroxide, halogenide, nitrate and sulfate, which are salts containing no carbon, be used as the substance. When materials substance selected from this group are used, it is desirable that they be preburnt in a reducing atmosphere, thereby forming active composite oxide powder, i.e., a precursor of an oxide superconductor. When this composite oxide powder is sintered in a oxygen atmosphere, an sintered mass having excellent superconducting properties is obtained.

The present invention will now be described in greater detail, with reference to various examples.

EXAMPLE 1

$BaCO_3$, $Y_2O_3$, and $CuO$ were used as material compounds. These compounds were mixed in mol ratio of: $(Y+Ba):Cu=1:1$. The resultant mixture was used as a material powder. Three hundred (300) grams of this powder was subjected to preburning at 950° C. for 6 hours in an oxygen-substituted atmosphere evacuated to oxygen partial pressure of $6\times10^{-3}$ Torr. The mass of the preburnt material was crushed into powders. These powders were classified. Those preburnt powders having an average particle diameter of 2 μm or less were processed, thus forming rings having a thickness of 7 mm, an outer diameter of 50 mm and an inner diameter of 30 mm, and also pellets having a diameter of 25 mm and a thickness of 5 mm. The rings and the pellets were sintered in the atmosphere at 880° C. for 2 hours, and further burned in an oxygen atmosphere at 850° C. for 6 hours. Then, the rings and the pellets were gradually cooled from 850° C. to 300° C. at the rate of 1° C./min, thus forming superconducting moldings.

EXAMPLE 2

Preburnt powder identical to the powder made in Example 1 and having an average particle diameter of 2 μm or less was processed, thus forming 5-turn coils having an outer diameter of 50 mm and made of a wire having a diameter of 2 mm, and also pipes having a length of 100 mm, an outer diameter of 10 mm and an inner diameter of 8 mm. The coils and the pipes were sintered in the atmosphere at 850° C. for 2 hours, and further burned in an oxygen atmosphere at 850° C. for 6 hours. Then, the coils and the pipes were slowly cooled from 850° C. to 300° C. at the rate of 1° C./min, thus forming superconducting moldings which had no cracks.

Control 1

Material powder identical to the powder made in Example 1 was preburnt at 950° C. for 6 hours in an atmosphere under oxygen partial pressure of 0.6 atm (the remaining partial pressure being of nytrogen; the total pressure being 1 atm). The material was then processed in the same way as in Example 1, thus forming rings and pellets, having the same shape and size as in Example 1. The rings and the pellets were first sintered, then burned, and finally cooled, under the same conditions as in Example 1, thereby forming superconducting moldings.

The density, critical temperatures (Tc), critical current density (Jc) of each of the superconducting moldings of Examples 1 and 2 and those of Control 1 were measured. The results were as shown in Table 1.

TABLE 1

|  | Shape of moldings | Density (%) | Tc (K) | Jc (A/cm$^2$) |
|---|---|---|---|---|
| Example 1 | Pellet | 98 | 95 | $7.3 \times 10^3$ |
|  | Ring | 97 | 95 | $7.2 \times 10^3$ |
| Example 2 | Coil | 97 | 95 | $7.1 \times 10^3$ |
|  | Pipe | 97 | 95 | $7.2 \times 10^3$ |
| Control 1 | Pellet | 91 | 55 | $1.5 \times 10^2$ |
|  | Ring | 89 | 54 | $1.4 \times 10^2$ |

As is evident from Table 1, the moldings of Examples 1 and 2 were dense moldings having a density of 95% or more of the theoretical density, and exhibited good superconducting characteristics such as Tc and Jc. In contrast, the moldings of Control 1, which had not been preburnt in an atmosphere having a low oxygen partial pressure, had a relatively low density and insufficient superconduction characteristics such as Tc and Jc.

EXAMPLE 3

$BaCO_3$, $Y_2O_3$, and $CuO$, each having an average particle diameter of 1 μm or less, were used as material compounds. These compounds were mixed uniformly in mol ratio of: $(Y+Ba):Cu=1:1$. The resultant mixture was molded, thereby forming rings having a thickness of 7 mm, an outer diameter of 50 mm, and an inner diameter of 30 mm, and also pellets having a thickness of 5 mm and a diameter of 25 mm. The rings and the pellets were sintered at 950° C. for 6 hours in an oxygen-substituted atmosphere evacuated to oxygen partial pressure of $6\times10^{-3}$ Torr. They were burnt in an oxygen atmosphere at 850° C. for 10 hours. The rings and the pellets were gradually cooled from 850° C. to 300° C. at the rate of 1° C./min, thus forming superconducting moldings.

EXAMPLE 4

Material powder identical to the powder made in Example 3 was processed, thus forming 5-turn coils having an outer diameter of 50 mm and made of a wire having a diameter of 2 mm, and also pipes having a length of 100 mm, an outer diameter of 10 mm and an inner diameter of 8 mm. The coils and the pipes were sintered and burnt in the same conditions as in Example 3, thus forming superconducting moldings.

Control 2

Rings and pellets of the same shape and size as those made in Example 3 were sintered in the atmosphere at 950° C. for 2 hours. They were then burnt in the atmosphere at 850° C. for 10 hours. These moldings were gradually cooled from 850° C. to 300° C. at the rate of 1° C./min, thus forming superconducting moldings.

The density, critical temperatures (Tc), critical current density (Jc) of each of the superconducting moldings of Examples 3 and 4 and those of Control 2 were measured. The results were as shown in Table 2.

TABLE 2

|  | Shape of moldings | Density (%) | Tc (K) | Jc (A/cm$^2$) |
|---|---|---|---|---|
| Example 3 | Pellet | 96 | 94 | $7.2 \times 10^3$ |
|  | Ring | 97 | 94 | $7.0 \times 10^3$ |
| Example 4 | Coil | 96 | 94 | $6.9 \times 10^3$ |

TABLE 2-continued

| | Shape of moldings | Density (%) | Tc (K) | Jc (A/cm$^2$) |
|---|---|---|---|---|
| | Pipe | 97 | 94 | $6.6 \times 10^3$ |
| Control 2 | Pellet | 93 | 57 | $1.2 \times 10^2$ |
| | Ring | 92 | 55 | $1.4 \times 10^2$ |

EXAMPLE 5

$BaCO_3$, $Y_2O_3$, and CuO, each having an average particle diameter of 1 μm or less, were used as material compounds. These compounds were mixed uniformly in mol ratio of: (Y+Ba):Cu=1:1. The resultant mixture was molded, thereby forming rings having a thickness of 7 mm, an outer diameter of 50 mm, and an inner diameter of 30 mm, and also pellets having a thickness of 5 mm and a diameter of 25 mm. These moldings were sintered at 950° C. for 6 hours in an oxygen-substituted atmosphere evacuated to oxygen partial pressure of $6 \times 10^{-3}$ Torr. They were burnt in the atmosphere at 850° C. for 6 hours. The moldings were further burnt in an oxygen atmosphere at 800° C. for 10 hours. The moldings were gradually cooled from 800° C. to 300° C. at the rate of 1° C./min, thus forming superconducting moldings.

EXAMPLE 6

Material powder identical to the powder made in Example 5 was processed, thus forming 5-turn coils having an outer diameter of 50 mm and made of a wire having a diameter of 2 mm, and also pipes having a length of 100 mm, an outer diameter of 10 mm and an inner diameter of 8 mm. The coils and the pipes were sintered and burnt in the same conditions as in Example 3, thus forming superconducting moldings.

The density, critical temperature (Tc), critical current density (Jc) of each of the superconducting moldings of Examples 5 and 6 were measured. The results were as shown in Table 3.

TABLE 3

| | Shape of moldings | Density (%) | Tc (K) | Jc (A/cm$^2$) |
|---|---|---|---|---|
| Example 5 | Pellet | 98 | 94 | $7.3 \times 10^3$ |
| | Ring | 98 | 94 | $7.1 \times 10^3$ |
| Example 6 | Coil | 98 | 94 | $7.0 \times 10^3$ |
| | Pipe | 98 | 94 | $7.2 \times 10^3$ |

As is evident from Tables 2 and 3, the moldings of Examples 3 to 6 were dense moldings having a density of 95% or more of the theoretical density, and exhibited good superconducting characteristics such as Tc and Jc. In contrast, the moldings of Control 2, which had not been preburnt in an atmosphere having a low oxygen partial pressure, had a relatively low density and insufficient superconducting characteristics such as Tc and Jc.

EXAMPLE 7

$BaCO_3$ which is an alkali earth metal compound, CuO which is a copper compound, and oxides of Y, Sm, Eu, Gd, Dy, Ho, Er, and Tm which are rare earth elements, were mixed such that the atomic ratio of the rare earth elements (Re), Ba, and Cu was: 1:2:3. Eight kinds of the resultant mixture, each being 100 g, were prepared. Each mixture was preburnt at 900° C. for 6 hours in a nitrogen-substituted atmosphere under 1 atm. and in a nitrogen-substituted atmosphere under 1 atm containing 5% of oxygen, respectively. Also, each mixture was preburnt at 900° C. for 6 hours, in oxygen-substituted atmospheres having oxygen partial pressures of 10 Torr, 5 Torr, 1 Torr, 0.1 Torr, $1 \times 10^{-2}$ Torr, $1 \times 10^{-3}$ Torr, and $1 \times 10^{-5}$ Torr, respectively. Each mixture, obtained by the preburning, was crushed into powder materials. These materials were molded into rods having a size of $3 \times 3 \times 20$ (length) mm, by means of a 3000 kg/cm$^2$ rubber press. These rods were sintered in the atmosphere at 950° C. for 2 hours. They were cooled to 850° C. within a furnace. Then, they were gradually cooled in an oxygen-substituted atmosphere at the rate of 1° C./min, thus forming superconducting moldings.

Control 3

Eight kinds of mixture identical to the mixture made in Example 7, each being 100 g, were preburnt in the atmosphere and a 100% oxygen atmosphere at 950° C. for 6 hrs. Each mixture, obtained by the preburning, was crushed into powder materials. These materials were molded into rods having a diameter of 3 mm and a length of 20 mm, by means of the 3000 kg/cm$^2$ rubber press. These rods were sintered under the same conditions as in Example 7. Then, they were cooled, also under the same conditions as in Example 7, thus forming superconducting moldings.

The relative density (%), critical temperatures (Tc), critical current density (Jc) measured at the temperature of liquid nitrogen (77K), and carbon content, of each of the superconducting moldings of Examples 7 and Control 3 were measured. Tc and Jc were measured by supplying electric currents to the moldings by means of four terminals, and the carbon content was measured by means of coulometric titration by radiofrequency induction heating and the density was measured by the Archimedean method. The results were as shown in Table 4.

| | No | Superconductor Preburning Atmosphere | Characteristics | | | |
|---|---|---|---|---|---|---|
| | | | Relative Density (%) | Tc (K) | Jc at 77K (A/cm$^2$) | Carbon Content (wt %) |
| | | | $YBa_2Cu_3O_{7-x}$ | | | |
| Example 7 | 1 | N2 1 atm. | 96 | 93 | $9.2 \times 10^3$ | 0.01 |
| | 2 | 95% N$_2$ + 5% O$_2$ | 97 | 95 | $11.4 \times 10^3$ | 0.01 |
| | 3 | O$_2$ 10 Torr | 96 | 94 | $10.2 \times 10^3$ | 0.01 |
| | 4 | O$_2$ 5 Torr | 97 | 95 | $11.6 \times 10^3$ | 0.005 |
| | 5 | O$_2$ 1 Torr | 97 | 95 | $12.1 \times 10^3$ | 0.005 |
| | 6 | O$_2$ 0.1 Torr | 96 | 94 | $10.6 \times 10^3$ | 0.005 |
| | 7 | O$_2$ $1 \times 10^{-2}$ Torr | 96 | 94 | $10.2 \times 10^3$ | 0.005 |
| | 8 | O$_2$ $1 \times 10^{-3}$ Torr | 96 | 94 | $9.8 \times 10^3$ | 0.005 |
| | 9 | O$_2$ $1 \times 10^{-5}$ Torr | 96 | 93 | $8.9 \times 10^3$ | 0.005 |
| Control 3 | 1-1 | air | 88 | 89 | $5.2 \times 10^2$ | 0.25 |
| | 1-2 | 100% O$_2$ | 87 | 88 | $4.6 \times 10^2$ | 0.25 |

-continued

|  |  | Superconductor Preburning | Characteristics | | | |
|---|---|---|---|---|---|---|
|  | No | Atmosphere | Relative Density (%) | Tc (K) | Jc at 77K (A/cm$^2$) | Carbon Content (wt %) |
| | | | SmBa$_2$Cu$_3$O$_{7-x}$ | | | |
| Example 7 | 1 | N$_2$ 1 atm. | 93 | 89 | 3.6 × 10$^3$ | 0.01 |
| | 2 | 95% N$_2$ + 5% O$_2$ | 94 | 90 | 4.2 × 10$^3$ | 0.01 |
| | 3 | O$_2$ 10 Torr | 93 | 89 | 3.8 × 10$^3$ | 0.01 |
| | 4 | O$_2$ 5 Torr | 94 | 89 | 4.3 × 10$^3$ | 0.005 |
| | 5 | O$_2$ 1 Torr | 94 | 90 | 4.6 × 10$^3$ | 0.005 |
| | 6 | O$_2$ 0.1 Torr | 93 | 89 | 4.1 × 10$^3$ | 0.005 |
| | 7 | O$_2$ 1 × 10$^{-2}$ Torr | 93 | 89 | 3.8 × 10$^3$ | 0.005 |
| | 8 | O$_2$ 1 × 10$^{-3}$ Torr | 93 | 89 | 3.6 × 10$^3$ | 0.005 |
| | 9 | O$_2$ 1 × 10$^{-5}$ Torr | 93 | 88 | 3.2 × 10$^3$ | 0.005 |
| Control 3 | 1-1 | air | 82 | 83 | 1.8 × 10$^2$ | 0.23 |
| | 1-2 | 100% O$_2$ | 81 | 82 | 1.2 × 10$^2$ | 0.24 |
| | | | EuBa$_2$Cu$_3$O$_{7-x}$ | | | |
| Example 7 | 1 | N$_2$ 1 atm. | 93 | 88 | 4.5 × 10$^3$ | 0.01 |
| | 2 | 95% N$_2$ + 5% O$_2$ | 94 | 89 | 5.2 × 10$^3$ | 0.01 |
| | 3 | O$_2$ 10 Torr | 93 | 88 | 4.8 × 10$^3$ | 0.01 |
| | 4 | O$_2$ 5 Torr | 94 | 89 | 5.0 × 10$^3$ | 0.005 |
| | 5 | O$_2$ 1 Torr | 94 | 90 | 5.4 × 10$^3$ | 0.005 |
| | 6 | O$_2$ 0.1 Torr | 93 | 90 | 5.3 × 10$^3$ | 0.005 |
| | 7 | O$_2$ 1 × 10$^{-2}$ Torr | 93 | 89 | 5.1 × 10$^3$ | 0.005 |
| | 8 | O$_2$ 1 × 10$^{-3}$ Torr | 93 | 89 | 4.9 × 10$^3$ | 0.005 |
| | 9 | O$_2$ 1 × 10$^{-5}$ Torr | 93 | 89 | 4.7 × 10$^3$ | 0.005 |
| Control 3 | 1-1 | air | 83 | 84 | 2.0 × 10$^2$ | 0.24 |
| | 1-2 | 100% O$_2$ | 82 | 82 | 1.8 × 10$^2$ | 0.24 |
| | | | GdBa$_2$Cu$_3$O$_{7-x}$ | | | |
| Example 7 | 1 | N$_2$ 1 atm. | 93 | 88 | 4.2 × 10$^3$ | 0.01 |
| | 2 | 95% N$_2$ + 5% O$_2$ | 94 | 89 | 4.8 × 10$^3$ | 0.01 |
| | 3 | O$_2$ 10 Torr | 93 | 88 | 4.4 × 10$^3$ | 0.01 |
| | 4 | O$_2$ 5 Torr | 94 | 89 | 4.8 × 10$^3$ | 0.005 |
| | 5 | O$_2$ 1 Torr | 94 | 90 | 5.0 × 10$^3$ | 0.005 |
| | 6 | O$_2$ 0.1 Torr | 93 | 90 | 4.8 × 10$^3$ | 0.005 |
| | 7 | O$_2$ 1 × 10$^{-2}$ Torr | 93 | 89 | 4.8 × 10$^3$ | 0.005 |
| | 8 | O$_2$ 1 × 10$^{-3}$ Torr | 93 | 89 | 4.4 × 10$^3$ | 0.005 |
| | 9 | O$_2$ 1 × 10$^{-5}$ Torr | 93 | 89 | 4.3 × 10$^3$ | 0.005 |
| Control 3 | 1-1 | air | 83 | 83 | 1.8 × 10$^2$ | 0.23 |
| | 1-2 | 100% O$_2$ | 82 | 82 | 1.4 × 10$^2$ | 0.24 |
| | | | DyBa$_2$Cu$_3$O$_{7-x}$ | | | |
| Example 7 | 1 | N$_2$ 1 atm. | 96 | 94 | 10.2 × 10$^3$ | 0.01 |
| | 2 | 95% N$_2$ + 5% O$_2$ | 97 | 95 | 12.1 × 10$^3$ | 0.01 |
| | 3 | O$_2$ 10 Torr | 96 | 94 | 11.8 × 10$^3$ | 0.01 |
| | 4 | O$_2$ 5 Torr | 97 | 95 | 12.5 × 10$^3$ | 0.005 |
| | 5 | O$_2$ 1 Torr | 97 | 95 | 12.8 × 10$^3$ | 0.005 |
| | 6 | O$_2$ 0.1 Torr | 96 | 94 | 12.2 × 10$^3$ | 0.005 |
| | 7 | O$_2$ 1 × 10$^{-2}$ Torr | 96 | 94 | 11.8 × 10$^3$ | 0.005 |
| | 8 | O$_2$ 1 × 10$^{-3}$ Torr | 96 | 94 | 10.5 × 10$^3$ | 0.005 |
| | 9 | O$_2$ 1 × 10$^{-5}$ Torr | 96 | 94 | 9.8 × 10$^3$ | 0.005 |
| Control 3 | 1-1 | air | 89 | 90 | 6.4 × 10$^2$ | 0.25 |
| | 1-2 | 100% O$_2$ | 88 | 89 | 5.5 × 10$^2$ | 0.25 |
| | | | HoBa$_2$Cu$_3$O$_{7-x}$ | | | |
| Example 7 | 1 | N$_2$ 1 atm. | 96 | 94 | 10.1 × 10$^3$ | 0.01 |
| | 2 | 95% N$_2$ + 5% O$_2$ | 97 | 95 | 11.9 × 10$^3$ | 0.01 |
| | 3 | O$_2$ 10 Torr | 96 | 94 | 11.6 × 10$^3$ | 0.01 |
| | 4 | O$_2$ 5 Torr | 97 | 95 | 12.2 × 10$^3$ | 0.005 |
| | 5 | O$_2$ 1 Torr | 97 | 95 | 12.5 × 10$^3$ | 0.005 |
| | 6 | O$_2$ 0.1 Torr | 96 | 94 | 12.0 × 10$^3$ | 0.005 |
| | 7 | O$_2$ 1 × 10$^{-2}$ Torr | 96 | 94 | 11.6 × 10$^3$ | 0.005 |
| | 8 | O$_2$ 1 × 10$^{-3}$ Torr | 96 | 94 | 10.2 × 10$^3$ | 0.005 |
| | 9 | O$_2$ 1 × 10$^{-5}$ Torr | 96 | 94 | 9.5 × 10$^3$ | 0.005 |
| Control 3 | 1-1 | air | 89 | 90 | 6.2 × 10$^2$ | 0.25 |
| | 1-2 | 100% O$_2$ | 88 | 89 | 5.3 × 10$^2$ | 0.24 |
| | | | ErBa$_2$Cu$_3$O$_{7-x}$ | | | |
| Example 7 | 1 | N$_2$ 1 atm. | 96 | 94 | 9.5 × 10$^3$ | 0.01 |
| | 2 | 95% N$_2$ + 5% O$_2$ | 97 | 95 | 11.6 × 10$^3$ | 0.01 |
| | 3 | O$_2$ 10 Torr | 96 | 94 | 11.2 × 10$^3$ | 0.01 |
| | 4 | O$_2$ 5 Torr | 97 | 95 | 12.0 × 10$^3$ | 0.005 |
| | 5 | O$_2$ 1 Torr | 97 | 95 | 12.2 × 10$^3$ | 0.005 |
| | 6 | O$_2$ 0.1 Torr | 96 | 94 | 11.6 × 10$^3$ | 0.005 |
| | 7 | O$_2$ 1 × 10$^{-2}$ Torr | 96 | 94 | 10.8 × 10$^3$ | 0.005 |
| | 8 | O$_2$ 1 × 10$^{-3}$ Torr | 96 | 94 | 10.2 × 10$^3$ | 0.005 |
| | 9 | O$_2$ 1 × 10$^{-5}$ Torr | 96 | 93 | 9.3 × 10$^3$ | 0.005 |
| Control 3 | 1-1 | air | 88 | 89 | 6.0 × 10$^2$ | 0.24 |
| | 1-2 | 100% O$_2$ | 87 | 88 | 5.1 × 10$^2$ | 0.24 |
| | | | TmBa$_2$Cu$_3$O$_{7-x}$ | | | |
| Example 7 | 1 | N$_2$ 1 atm. | 95 | 93 | 8.3 × 10$^3$ | 0.01 |
| | 2 | 95% N$_2$ + 5% O$_2$ | 96 | 94 | 9.5 × 10$^3$ | 0.01 |
| | 3 | O$_2$ 10 Torr | 95 | 93 | 9.2 × 10$^3$ | 0.01 |

-continued

|  | No | Superconductor Preburning Atmosphere | Characteristics | | | Carbon Content (wt %) |
|---|---|---|---|---|---|---|
|  |  |  | Relative Density (%) | Tc (K) | Jc at 77K (A/cm$^2$) |  |
|  | 4 | $O_2$ 5 Torr | 96 | 94 | $9.8 \times 10^3$ | 0.005 |
|  | 5 | $O_2$ 1 Torr | 96 | 94 | $10.0 \times 10^3$ | 0.005 |
|  | 6 | $O_2$ 0.1 Torr | 96 | 93 | $9.8 \times 10^3$ | 0.005 |
|  | 7 | $O_2$ $1 \times 10^{-2}$ Torr | 95 | 93 | $9.6 \times 10^3$ | 0.005 |
|  | 8 | $O_2$ $1 \times 10^{-3}$ Torr | 95 | 93 | $9.4 \times 10^3$ | 0.005 |
|  | 9 | $O_2$ $1 \times 10^{-5}$ Torr | 95 | 92 | $8.7 \times 10^3$ | 0.005 |
| Control 3 | 1-1 | air | 86 | 88 | $4.8 \times 10^2$ | 0.24 |
|  | 1-2 | 100% $O_2$ | 85 | 86 | $4.2 \times 10^2$ | 0.24 |

As can be understood from Table 4, the moldings made by the method according to Example 7 contained 0.1 wt % or less of carbon, and were dense moldings having a density of 93% or more of the theoretical density. Further, they had good superconducting characteristics such as Tc and Jc. In contrast, the moldings of Control 3, which have been preburnt in atmospheres falling outside the scope of the present invention, had an insufficient density and high carbon contents, and exhibited insufficient superconducting characteristics such as Tc and Jc.

EXAMPLE 8

Material compounds identical to those used in Example 7 were mixed such that the atomic ratio of the rare earth elements (Re), Ba, and Cu was: 1:2:3. Eight kinds of the resultant mixture powder, each being 100 g, were preburnt at 900° C. for 6 hours in an oxygen-substituted atmosphere evacuated to $1 \times 10^{-2}$ Torr, thus forming eight masses of the mixture. Each mass was crushed into powder of the composite oxide, having an average particle diameter of 2 μm. Each powder was molded into a rod having a size of $3 \times 3 \times 20$ (length) mm, by means of a 3000 kg/cm$^2$ rubber press. These rods were sintered at 950° C. for 2 hours, in the atmospheres having oxygen partial pressures of 1 Torr, 5 Torr, 10 Torr, 50 Torr and 150 Torr (the remaining partial pressure being of nitrogen; the total pressure being 760 Torr), and pure oxygen atmosphere having a pressure of 760 Torr, respectively. The rods, thus sintered, were cooled to 850° C. in the furnace, and were further gradually cooled in an oxygen-substituted atmosphere at the rate of 1° C./min.

Control 4

Eight kinds of the mixture powder identical to the one prepared in Example 8, each being 100 g, were preburnt at 950° C. for 6 hours in the atmosphere, thus forming eight masses of the mixture. Each mass was crushed into powder of the composite oxide, having an average particle diameter of 2 μm. Each powder was molded into a rod having the same size by the same rubber press, as in Example 8. These rods were sintered at 950° C. for 2 hours, in the atmospheres having oxygen partial pressures of 1 Torr, 10 Torr, 150 Torr (the remaining partial pressure being of nitrogen; the total pressure being 760 Torr), and pure oxygen atmosphere having a pressure of 760 Torr, respectively. The rods, thus sintered, were cooled to 850° C. in the furnace, and were further gradually cooled in an oxygen-substituted atmosphere at the rate of 1° C./min.

The relative density (%), critical temperatures (Tc), critical current density (Jc) measured at the temperature of liquid nitrogen (77K), and carbon content, of each of the superconducting moldings of Examples 8 and Control 4 were measured in the same manner as in Example 7. The results were as shown in Table 5.

TABLE 5

|  |  | Superconductor | | $YBa_2Cu_3O_{7-x}$ | | | | $SmBa_2Cu_3O_{7-x}$ | | | |
|---|---|---|---|---|---|---|---|---|---|---|---|
|  | No | Sintering Atmosphere | Characteristics | Relative Density (%) | Tc (K) | Jc at 77K (A/cm$^2$) | Carbon Content (wt %) | Relative Density (%) | Tc (K) | Jc at 77K (A/cm$^2$) | Carbon Content (wt %) |
| Example 8 | 1 | $O_2$ | 1 Torr | 97 | 94 | $4.2 \times 10^3$ | 0.005 | 95 | 89 | $1.7 \times 10^3$ | 0.005 |
|  | 2 | " | 5 Torr | 97 | 95 | $9.8 \times 10^3$ | " | 94 | 90 | $3.6 \times 10^3$ | " |
|  | 3 | " | 10 Torr | 97 | 95 | $14.4 \times 10^3$ | " | 94 | 90 | $5.6 \times 10^3$ | " |
|  | 4 | " | 50 Torr | 97 | 94 | $12.8 \times 10^3$ | " | 93 | 89 | $4.5 \times 10^3$ | " |
|  | 5 | " | 150 Torr | 96 | 94 | $10.2 \times 10^3$ | " | 93 | 89 | $3.8 \times 10^3$ | " |
|  | 6 | " | 760 Torr | 96 | 94 | $8.5 \times 10^3$ | " | 93 | 89 | $3.2 \times 10^3$ | " |
| Control 4 | 1 | " | 1 Torr | 89 | 90 | $4.1 \times 10^2$ | 0.12 | 84 | 83 | $1.2 \times 10^2$ | 0.10 |
|  | 2 | " | 10 Torr | 90 | 90 | $9.7 \times 10^2$ | 0.15 | 84 | 84 | $2.5 \times 10^2$ | 0.12 |
|  | 3 | " | 150 Torr | 88 | 89 | $5.2 \times 10^2$ | 0.25 | 82 | 83 | $1.8 \times 10^2$ | 0.23 |
|  | 4 | " | 760 Torr | 87 | 88 | $4.3 \times 10^2$ | 0.25 | 82 | 83 | $1.6 \times 10^2$ | 0.23 |
|  |  | Superconductor | | $EuBa_2Cu_3O_{7-x}$ | | | | $GdBa_2Cu_3O_{7-x}$ | | | |
|  | No | Sintering Atmosphere | Characteristics | Relative Density (%) | Tc (K) | Jc at 77K (A/cm$^2$) | Carbon Content (wt %) | Relative Density (%) | Tc (K) | Jc at 77K (A/cm$^2$) | Carbon Content (wt %) |
| Example 8 | 1 | $O_2$ | 1 Torr | 94 | 89 | $2.1 \times 10^3$ | 0.005 | 94 | 89 | $1.9 \times 10^3$ | 0.005 |
|  | 2 | " | 5 Torr | 94 | 90 | $4.2 \times 10^3$ | " | 94 | 90 | $4.0 \times 10^3$ | " |
|  | 3 | " | 10 Torr | 94 | 90 | $6.2 \times 10^3$ | " | 94 | 90 | $5.8 \times 10^3$ | " |
|  | 4 | " | 50 Torr | 93 | 89 | $5.5 \times 10^3$ | " | 93 | 89 | $5.2 \times 10^3$ | " |
|  | 5 | " | 150 Torr | 93 | 89 | $5.1 \times 10^3$ | " | 93 | 89 | $4.8 \times 10^3$ | " |
|  | 6 | " | 760 Torr | 93 | 89 | $4.4 \times 10^3$ | " | 93 | 89 | $4.2 \times 10^3$ | " |
| Control 4 | 1 | " | 1 Torr | 84 | 84 | $1.4 \times 10^2$ | 0.11 | 84 | 83 | $1.2 \times 10^2$ | 0.10 |
|  | 2 | " | 10 Torr | 84 | 85 | $3.2 \times 10^2$ | 0.13 | 84 | 84 | $2.3 \times 10^2$ | 0.12 |
|  | 3 | " | 150 Torr | 83 | 84 | $2.0 \times 10^2$ | 0.24 | 83 | 83 | $1.8 \times 10^2$ | 0.23 |
|  | 4 | " | 760 Torr | 83 | 84 | $1.8 \times 10^2$ | 0.24 | 82 | 83 | $1.5 \times 10^2$ | 0.23 |

TABLE 5-continued

| | No | Superconductor Sintering Atmosphere | Superconductor Charac- teristics | DyBa$_2$Cu$_3$O$_{7-x}$ Relative Density (%) | Tc (K) | Jc at 77K (A/cm$^2$) | Carbon Content (wt %) | HoBa$_2$Cu$_3$O$_{7-x}$ Relative Density (%) | Tc (K) | Jc at 77K (A/cm$^2$) | Carbon Content (wt %) |
|---|---|---|---|---|---|---|---|---|---|---|---|
| Example 8 | 1 | O$_2$ | 1 Torr | 97 | 94 | 5.6 × 10$^3$ | 0.005 | 97 | 94 | 5.2 × 10$^3$ | 0.005 |
| | 2 | " | 5 Torr | 97 | 95 | 10.2 × 10$^3$ | " | 97 | 95 | 10.0 × 10$^3$ | " |
| | 3 | " | 10 Torr | 97 | 95 | 15.6 × 10$^3$ | " | 97 | 95 | 14.8 × 10$^3$ | " |
| | 4 | " | 50 Torr | 97 | 94 | 13.2 × 10$^3$ | " | 97 | 94 | 12.8 × 10$^3$ | " |
| | 5 | " | 150 Torr | 96 | 94 | 11.8 × 10$^3$ | " | 96 | 94 | 11.6 × 10$^3$ | " |
| | 6 | " | 760 Torr | 96 | 94 | 9.2 × 10$^3$ | " | 96 | 94 | 9.0 × 10$^3$ | " |
| Control 4 | 1 | " | 1 Torr | 90 | 90 | 3.6 × 10$^2$ | 0.12 | 90 | 90 | 3.2 × 10$^2$ | 0.11 |
| | 2 | " | 10 Torr | 90 | 91 | 8.2 × 10$^2$ | 0.15 | 90 | 91 | 8.0 × 10$^2$ | 0.14 |
| | 3 | " | 150 Torr | 89 | 90 | 6.4 × 10$^2$ | 0.25 | 89 | 90 | 6.2 × 10$^2$ | 0.25 |
| | 4 | " | 760 Torr | 88 | 89 | 5.8 × 10$^2$ | 0.25 | 88 | 89 | 5.5 × 10$^2$ | 0.25 |

| | No | Superconductor Sintering Atmosphere | Superconductor Charac- teristics | ErBa$_2$Cu$_3$O$_{7-x}$ Relative Density (%) | Tc (K) | Jc at 77K (A/cm$^2$) | Carbon Content (wt %) | TmBa$_2$Cu$_3$O$_{7-x}$ Relative Density (%) | Tc (K) | Jc at 77K (A/cm$^2$) | Carbon Content (wt %) |
|---|---|---|---|---|---|---|---|---|---|---|---|
| Example 8 | 1 | O$_2$ | 1 Torr | 97 | 94 | 5.5 × 10$^3$ | 0.005 | 97 | 93 | 4.0 × 10$^3$ | 0.005 |
| | 2 | " | 5 Torr | 97 | 95 | 10.1 × 10$^3$ | " | 97 | 93 | 9.5 × 10$^3$ | " |
| | 3 | " | 10 Torr | 97 | 95 | 14.6 × 10$^3$ | " | 97 | 94 | 13.8 × 10$^3$ | " |
| | 4 | " | 50 Torr | 97 | 94 | 13.2 × 10$^3$ | " | 96 | 93 | 11.9 × 10$^3$ | " |
| | 5 | " | 150 Torr | 96 | 94 | 10.8 × 10$^3$ | " | 95 | 93 | 9.6 × 10$^3$ | " |
| | 6 | " | 760 Torr | 96 | 94 | 8.9 × 10$^3$ | " | 95 | 93 | 8.2 × 10$^3$ | " |
| Control 4 | 1 | " | 1 Torr | 89 | 89 | 3.1 × 10$^2$ | 0.11 | 87 | 88 | 2.2 × 10$^2$ | 0.12 |
| | 2 | " | 10 Torr | 90 | 90 | 7.8 × 10$^2$ | 0.13 | 88 | 90 | 6.0 × 10$^2$ | 0.14 |
| | 3 | " | 150 Torr | 88 | 89 | 6.0 × 10$^2$ | 0.24 | 86 | 88 | 4.8 × 10$^2$ | 0.24 |
| | 4 | " | 760 Torr | 88 | 89 | 5.3 × 10$^2$ | 0.24 | 86 | 87 | 4.2 × 10$^2$ | 0.24 |

As is evident from Table 5, the moldings made by the method according to Example 8 contained 0.1 wt % or less of carbon, and were dense moldings having a density of 93% or more of the theoretical density, Further, they had good superconducting characteristics such as Tc and Jc. In contrast, the moldings of Control 4, which have been preburnt in atmospheres falling outside the scope of the present invention, had an insufficient density and high carbon contents, and exhibited insufficient superconducting characteristics such as Tc and Jc.

EXAMPLE 9

A solution of yttrium nitrate, a solution of barium nitrate, and a solution of copper nitrate were mixed such that the ratio Y:Ba:Cu was 1:2:3. Then, oxalic acid was added to the mixture, thereby co-precipitating oxalate. The co-precipitated powder, thus obtained, was spray-dried, thereby forming mixture powder. The powder was fine, having an average particle diameter of 0.5 μm. Y, Ba, and Cu particles were homogeneously dispersed. The mixture powder was preburnt at 700° C. for 4 hours in an atmosphere evacuated to oxygen partial pressure of $1 \times 10^{-2}$ Torr, thus obtaining a mass of preburnt material. Then the mass was crushed for 40 hours by a ball mill by using toluene as a medium, thus forming powder. This powder was dried by means of a spray drier, thereby preparing powder of composite oxide which had an average particle diameter of 1 μm.

The powder of composite oxide was molded into pellets which had a diameter of 25 mm. The pellets were sintered in an oxygen flow at 900° C. for 2 hours. They were then burnt also in an oxygen flow at 850° C. for 20 hours. The pellets were cooled to 200° C. at the rate of 2° C./min. Further, they were cooled with air.

The superconducting moldings, thus made, had a density of 95%, Tc of 93K, and Jc of $5 \times 10^3$ A/cm$^2$ at the temperature of liquid nitrogen.

Control 5

Powders of Y$_2$O$_3$, BaCO$_3$, and CuO, which had an average particle diameter of 2 μm, were mixed such that the ratio of Y:Ba:Cu was 1:2:3. These powders were kneaded by a ball mill for 40 hours, by using toluene as a medium. The kneaded mixture was dried by means of a spray drier, and preburnt at 850° C. for 6 hours in an oxygen flow. The dried, preburnt mixture was crushed by a ball mill for 40 hours, by using toluene as a medium, into powder. The powder was spray-dried, thus forming composite oxide powder having an average particle diameter of 1.5 μm.

This composite oxide powder was molded, thereby forming pellets having a diameter of 25 mm. The pellets were sintered in an oxygen flow at 900° C. for 2 hours. They were then burnt also in an oxygen flow at 850° C. for 20 hours. The pellets were cooled to 200° C. at the rate of 2° C./min. Further, they were cooled with air.

The superconducting moldings, thus made, had a density of 91%, Tc of 92K, and Jc of $6 \times 10^3$ A/cm$^2$ at the temperature of liquid nitrogen.

EXAMPLE 10

BaCO$_3$, Y$_2$O$_3$, Er2O3 and CuO were used as material compounds. These compounds were mixed in atomic ratio of: (Y+Er):Ba:Cu=1:2:3, and also in atomic ratio of: Y:Er=9:1. The resultant mixture was used as a material powder. Five hundred (500) grams of the powder was preburnt at 900° C. for 4 hours in an oxygen-substituted atmosphere evacuated to oxygen partial pressure of $2 \times 10^{-2}$ Torr. The mass of the preburnt material was crushed into powders. These powders were classified, thereby preparing powder of composite oxide having an average diameter of 2 μm or less. The powder of composite oxide was molded into pellets having a diameter of 25 mm and a thickness of 5 mm. These pellets were sintered at 880° C. for 2 hours in an oxygen atmosphere, and then burnt at 800° C. for 24 hours in an oxygen atmosphere. Then, the pellets were gradually cooled from 800° C. to 400° C. at the rate of 2° C./min, thereby forming superconducting moldings.

EXAMPLE 11

The powder of composite oxide identical to the powder made in Example 10 and having a particle diameter of 2 μm or less was molded, thus forming 5-turn coils having an outer diameter of 50 mm and made of a wire having a diameter of 2 mm, and also pipes having a length of 100 mm, an outer diameter of 10 mm and an inner diameter of 8 mm. The coils and the pipes were sintered at 880° C. for 2 hours in an oxygen atmosphere, and further burnt at 700° C. for 20 hours in an oxygen atmosphere. Then, the coils and the pipes were gradually cooled from 700° C. to 300° C. at the rate of 1° C./min, thus forming superconducting moldings which had no cracks.

EXAMPLE 12

$Ba(NO_3)_2$, $Sr(NO_3)_2$, $Y(NO_3)_3$ and $Cu(NO_3)_2$ were used as material compounds. These compounds were mixed in atomic ratio of: Y:(Ba+Sr):Cu=1:2:3, and also in atomic ratio of: Ba:Sr=4:1, thereby forming mixture powder. Five hundred (500) grams of the powder was preburnt at 810° C. for 7 hours in an oxygen-substituted atmosphere evacuated to oxygen partial pressure of 10 Torr. From this preburnt material, the moldings of the same size and shape as in Example 10 were made through molding, sintering, and burning, all under the same conditions as in Example 10.

Control 6

Mixture powder identical to that obtained and used in Example 10 was preburnt at 900° C. for 8 hours in an atmosphere whose oxygen partial pressure was 0.6 atm (the remaining partial pressure being of nitrogen; the total pressure being 1 atm). From this preburnt material, the moldings of the same size and shape as in Example 10 were made through molding, sintering, and burning, all under the same conditions as in Example 10, except that both the sintering and the burning were carried out in the atmosphere. As a result, superconducting moldings were made.

The density, critical temperatures (Tc), critical current density (Jc) measured at the temperature of liquid nitrogen (77K), and carbon content, of each of the superconducting moldings of Examples 10, 11, and 12, and Control 6 were measured. The results were as shown in Table 6.

TABLE 6

| | Shape of moldings | Density (%) | Tc (K) | Jc at 77K (A/cm$^2$) | C Content (wt %) |
|---|---|---|---|---|---|
| Example 10 | Pellet | 97 | 95 | $6.5 \times 10^3$ | 0.05 |
| Example 11 | Coil | 96 | 93 | $7.1 \times 10^3$ | 0.06 |
| | Pipe | 95 | 93 | $7.7 \times 10^3$ | 0.06 |
| Example 12 | Pellet | 95 | 94 | $9.9 \times 10^3$ | 0.01 |
| Control 6 | Pellet | 90 | 91 | $1.3 \times 10^2$ | 0.25 |

As is evident from Table 6, the moldings of Examples 10 to 12 contained a carbon of 0.1 wt % or less and were dense moldings having a density of 95% or more of the theoretical density, and exhibited good superconducting characteristics such as Tc and Jc. In contrast, the moldings of Control 6, which had not been preburnt in an atmosphere having a low oxygen partial pressure, contained much carbon, had a relatively low density and insufficient superconducting characteristics such as Tc and Jc.

EXAMPLE 13 AND CONTROLS 7-8

$Ba(NO_3)_2$, $Y(NO_3)_3$, $Ti(NO_3)_2$, and $Cu(NO_3)_2$ were used as material compounds. These compounds were mixed in atomic ratio of Y:Ba:(Cu+Ti)=1:2:3, and also in atomic ratio of Cu:Ti=9:1, thereby forming mixture powder. Seven portions of this mixture powder, each being 500 g were first pre-heated for dehydration in the atmosphere at 300° C. for 3 hours. Then, they were preburnt at the different temperatures specified in Table 7 in a heating furnace evacuated to 0.5 Torr. The preburning time was 6 hours when the preburning temperature ranged from 450° C. to 650° C., and 3 hours when the preburning temperature ranged from 750° C. to 1050° C. From the preburnt materials, the moldings of the same size and shape as in Example 10 were made through molding, sintering, and burning, all under the same conditions as in Example 10.

The density, critical temperatures (Tc), critical current density (Jc) measured at the temperature of liquid nitrogen (77K), and carbon content of each of the superconducting moldings of Examples 13-1 to 13-5, and Controls 7 and 8 were measured. The results were as shown in Table 7.

TABLE 7

| | Temp. (°C.) | Density (%) | Tc (K) | Jc at 77K (A/cm$^2$) | C Content (wt %) |
|---|---|---|---|---|---|
| Example 13-1 | 550 | 97 | 92 | $7.1 \times 10^3$ | 0.02 |
| Example 13-2 | 650 | 98 | 94 | $9.2 \times 10^3$ | 0.02 |
| Example 13-3 | 750 | 98 | 94 | $9.5 \times 10^3$ | 0.02 |
| Example 13-4 | 850 | 97 | 94 | $9.9 \times 10^3$ | 0.02 |
| Example 13-5 | 950 | 95 | 93 | $8.5 \times 10^3$ | 0.02 |
| Control 7 | 350 | 89 | 85 | $5.5 \times 10^3$ | 0.03 |
| Control 8 | 1050 | 90 | 81 | $2.2 \times 10^3$ | 0.02 |

As is clearly shown in Table 7, the moldings of Examples 13-1 to 13-5 had a carbon content of 0.1 wt % or less and were dense moldings having a density of 95% or more of the theoretical density, and exhibited good superconducting characteristics such as Tc and Jc. In contrast, the moldings of Controls 7 and 8, made from the mixture powder which had not been preburnt at temperatures falling outside the range according to the present invention, had a relatively low density and insufficient superconducting characteristics such as Tc and Jc.

EXAMPLE 14 AND CONTROLS 9-10

Eight portions of mixture powder identical to that prepared in Example 13, each weighing 500 g, were preburnt at 750° C. for 3 hours in atmospheres having the different oxygen partial pressures specified in Table 8. The portions of the preburnt powder were molded into pellets of the same size and shape as in Example 10. These pellets were sintered under the same conditions as in Example 10, thereby forming superconducting moldings.

The density, critical temperature (Tc), critical current density (Jc) measured at the temperature of liquid nitrogen (77K), and carbon content of each of the superconducting moldings of Examples 14-1 to 14-6, and Controls 9 and 10, were measured. The results were as shown in Table 8.

TABLE 8

| | O.P.P. (Torr) | Density (%) | Tc (K) | Jc at 77K (A/cm$^2$) | C Content (wt %) |
|---|---|---|---|---|---|
| Example 14-1 | $1 \times 10^{-3}$ | 98.5 | 94 | $9.9 \times 10^3$ | 0.005 |

TABLE 8-continued

| | O.P.P. (Torr) | Density (%) | Tc (K) | Jc at 77K (A/cm$^2$) | C Content (wt %) |
|---|---|---|---|---|---|
| Example 14-2 | $1 \times 10^{-2}$ | 98 | 94 | $9.7 \times 10^3$ | 0.01 |
| Example 14-3 | $1 \times 10^{-1}$ | 98 | 94 | $9.5 \times 10^3$ | 0.02 |
| Example 14-4 | 1 | 97.5 | 93 | $9.3 \times 10^3$ | 0.02 |
| Example 14-5 | 10 | 97 | 92 | $6.2 \times 10^3$ | 0.03 |
| Example 14-6 | 40 | 96 | 91 | $2.2 \times 10^3$ | 0.05 |
| Control 9 | 75 | 93 | 89 | $5.3 \times 10^2$ | 0.15 |
| Control 10 | 150 | 90 | 85 | $1.5 \times 10^2$ | 0.3 |

Note:
O.P.P.: Oxygen Partial Pressure

As is evident from Table 8, the moldings of Examples 14-1 to 14-6 had a carbon content of 0.1 wt % or less and a high density, and exhibited good superconducting characteristics such as Tc and Jc. Also as is apparent from Table 8, the lower the oxygen partial pressure, the better the superconducting characteristics. This is because, the less the residual carbon content in the composite oxide powder, the greater the deficiency of oxygen, and hence, the more prominent the activation of composite oxide powder. In contrast, the moldings of Controls 9 and 10, made from the mixture powder which had not been preburnt in the atmospheres having the oxygen partial pressures falling outside the range in this invention, had a carbon content over 0.1 wt %, a low density, and insufficient superconducting characteristics such as Tc and Jc.

EXAMPLES 15

$Y_2O_3$, $BaCO_3$, and CuO were used as material compounds. The compounds were mixed, thus forming mixture powder, in mol ratio of Y:Ba:Cu=1:2:3. Two hundred (200) grams of the mixture powder was subjected to the primary preburning at 900° C. for 10 hours in an oxygen-substituted atmosphere evacuated to oxygen partial pressure of $7 \times 10^{-3}$ Torr, thereby forming preburnt powder containing deficient oxygen. This powder was then subjected to the secondary preburning at 830° C. for 10 hours in an atmosphere having an oxygen partial pressure of 80 Torr (the remaining partial pressure being of nitrogen; the total pressure being 1 atm), thereby forming composite oxide powder. The composite oxide powder was crushed into finer powder, which were classified. Those powders having an average diameter of 2 μm or less was compressed and molded into pellets having a diameter of 25 mm and a thickness of 2 mm. These pellets were sintered at 880° C. for 6 hours in an oxygen atmosphere. The sintered pellets were gradually cooled from 800° C. to 400° C. at the rate of 1° C./min, thus forming superconducting moldings.

EXAMPLE 16

The same composite oxide powder as obtained in Example 15 was molded into 5-turn coils made of a wire having a diameter of 1 mm, having an outer diameter of 50 mm, and also into pipes having an outer diameter of 12 mm, an inner diameter of 10 mm, and a length of 100 mm. The coils and the pipes were sintered at 880° C. for 6 hours in an oxygen atmosphere. They are further burnt at 700° C. for 20 hours in an oxygen atmosphere. Then, the coils and the pipes were gradually cooled from 700° C. to 300° C. at the rate of 1° C./min. As a result of this, superconducting coils having no cracks (Example 16-1), and superconducting pipes having no cracks (Example 16-2) were obtained.

EXAMPLE 17

Three superconducting moldings were formed in the same way as in Example 15, except that the secondary preburning was carried out at 650° C., 780° C., and 980° C. in an oxygen atmosphere.

Control 11

Two superconducting moldings were formed in the same way as in Example 15, except that the primary preburning was performed at 360° C. and 1050° C. under a reduced pressure.

Control 12

Superconducting molding was formed in the same way as in Example 15, except that the primary preburning was performed in an atmosphere having an oxygen partial pressure of 300 Torr.

Control 13

Two superconducting moldings were formed in the same way as in Example 15, except that the secondary preburning was performed at 360° C. and 1050° C. in an oxygen atmosphere.

Control 14

The same mixture powder as prepared in Example 15 was preburnt at 950° C. for 6 hours in an oxygen atmosphere (100% $O_2$). The preburnt powder was molded and sintered under the same conditions as in Example 15, thereby forming superconducting moldings.

The conditions of the primary and secondary preburning, and the shapes of the superconducting moldings of Examples 15 to 17 and controls 11 to 14 were as shown in Table 9.

The density, critical temperature (Tc), critical current density (Jc) measured at the temperature of liquid nitrogen (77K), and carbon content, of each of the superconducting moldings of Examples 15, Examples 16-1 and 16-2, Examples 17-1 to 17-3, Controls 11-1 and 11-2, Control 12, Controls 13-1 and 13-2, and Control 14 were measured. The results were as shown in Table 10.

TABLE 9

| | No | Conditions of Primary Preburning | | | Conditions of Secondary Preburning | | | Shape of Moldings |
|---|---|---|---|---|---|---|---|---|
| | | Temp. (°C.) | Time (hr) | $O_2$ Partial Pressure (Torr) | Temp. (°C.) | Time (hr) | $O_2$ Partial Pressure (Torr) | |
| Example | 15 | 900 | 10 | $7 \times 10^{-3}$ | 830 | 10 | 80 | Pellet |
| | 16-1 | " | " | " | " | " | " | Coil |
| | 16-2 | " | " | " | " | " | " | Pipe |
| | 17-1 | " | " | " | 980 | " | " | Pellet |
| | 17-2 | " | " | " | 780 | " | " | " |
| | 17-3 | " | " | " | 650 | " | " | " |
| Control | 11-1 | 360 | " | " | 830 | " | " | " |

TABLE 9-continued

| | Conditions of Primary Preburning | | | Conditions of Secondary Preburning | | | |
|---|---|---|---|---|---|---|---|
| No | Temp. (°C.) | Time (hr) | $O_2$ Partial Pressure (Torr) | Temp. (°C.) | Time (hr) | $O_2$ Partial Pressure (Torr) | Shape of Moldings |
| 11-2 | 1050 | " | " | " | " | " | " |
| 12 | 900 | " | 300 | " | " | " | " |
| 13-1 | " | " | $7 \times 10^{-3}$ | 460 | " | " | " |
| 13-2 | " | " | " | 1050 | " | " | " |
| 14 | — | — | — | 950 | 6 | 760 | " |

TABLE 10

| | No | Density (%) | Tc (K) | Jc at 77K (A/cm$^2$) | C Content (wt %) |
|---|---|---|---|---|---|
| Example | 15 | 97 | 95 | $9.2 \times 10^3$ | 0.01 |
| | 16-1 | 96 | 93 | $8.2 \times 10^3$ | 0.01 |
| | 16-2 | 96 | 93 | $8.3 \times 10^3$ | 0.01 |
| | 17-1 | 96 | 93 | $7.6 \times 10^3$ | 0.01 |
| | 17-2 | 97 | 94 | $9.1 \times 10^3$ | 0.01 |
| | 17-3 | 96 | 93 | $7.7 \times 10^3$ | 0.02 |
| Control | 11-1 | 87 | 88 | $1.4 \times 10^2$ | 1.5 |
| | 11-2 | 88 | 89 | $2.2 \times 10^2$ | 0.007 |
| | 12 | 88 | 87 | $2.0 \times 10^2$ | 0.18 |
| | 13-1 | 88 | 88 | $2.1 \times 10^2$ | 0.04 |
| | 13-2 | 87 | 88 | $1.8 \times 10^2$ | 0.01 |
| | 14 | 89 | 90 | $3.5 \times 10^2$ | 0.23 |

As is evident from Table 10, the moldings of Example 15, Example 16-1 and 16-2, and Examples 17-1 to 17-3, had a residual carbon content of 0.1 wt % or less and were dense moldings having a density of 95% or more of the theoretical density, and exhibited good superconducting characteristics such as Tc and Jc. Particularly, the moldings of Example 15, Example 16-1 and 16-2 and Example 17-2, which had been made through the secondary preburning performed at temperature ranging from 700° C. to 900° C., exhibited excellent superconducting characteristics. In contrast, the moldings of Controls 11-1 an 11-2, Control 12, and Controls 13-1 and 13-2, which had been made by preburning the mixture powder under the conditions falling outside the scope of the invention, generally contained much residual carbon content, had a relatively low density and insufficient superconduction characteristics such as Tc and Jc. This is because the powder was not sufficiently preburnt, or a different phase was deposited in the preburnt powder. The molding of Control 14, which has been made from the mixture powder not subjected to the primary preburning under a low oxygen partial pressure, contained a great amount of carbon residue, and had a low density and exhibited insufficient Tc and Jc.

All examples described above are oxide superconductors made of alkaline earth metals, rare earth elements, and copper. The method according to the present invention is not limited to the manufacture of these oxide superconductors. Needless to say, it can be applied to manufacture of oxide superconductors made of, mainly, bismuth, strontium, calcium, and copper.

EXAMPLE 18

$BaCO_3$, $Y_2O_3$, $Er_2O_3$ and CuO were used as material compounds. The compounds were mixed, thus forming mixture powder, in atomic ratio of (Y+Er):Ba:Cu=1:2:3, and also atomic ratio of Y:Er=9:1. Five hundred (500) grams of the mixture powder was preburnt at 900° C. for 4 hours in a hydrogen-substituted reducing atmosphere evacuated to hydrogen partial pressure of 10 Torr. The preburnt material was crushed into powders. These powders were classified, and those having an average particle diameter of 2 μm or less were molded into pellets having a diameter of 25 mm and a thickness of 5 mm. These pellets were sintered at 880° C. for 2 hours in an oxygen atmosphere. The sintered pellets were then burnt at 800° C. for 24 hours in an oxygen atmosphere. The pellets were gradually cooled from 800° C. to 400° C. at the rate of 2° C./min, thus forming superconducting moldings.

EXAMPLE 19

The same mixture powder as obtained and used in Example 18 was preburnt 920° C. for 4 hours in a CO gas-substituted reducing atmosphere evacuated to CO partial pressure of 1 Torr. This preburnt material was crushed into powders. These powders were classified, and those having an average diameter of 2 μm or less were molded into pellets having a diameter of 25 mm and a thickness of 5 mm. These pellets were first sintered, then burnt, and finally cooled under the same conditions as in Example 18, thus forming superconducting moldings.

EXAMPLE 20

$Ba(NO_3)_2$, $Sr(NO_3)_2$, $Y(NO_3)_3$, and $Cu(NO_3)_2$ were used as material compounds. The compounds were mixed, thus forming mixture powder, in atomic ratio of Y:(Ba+Sr):Cu=1:2:3, and also atomic ratio of: Ba:Sr=4:1. Five hundred (500) grams of the mixture powder was preburnt at 750° C. for 2 hours in a reducing atmosphere evacuated to hydrogen partial pressure of 10 Torr. The preburnt material was molded, sintered, burnt and cooled under the same conditions as in Example 18, thereby forming superconducting moldings.

Control 15

The same mixture powder as obtained and used in Example 18 was preburnt 900° C. for 8 hours in the ordinary atmosphere. The preburnt material was molded, sintered, burnt and cooled under the same conditions as in Example 18, thereby forming superconducting moldings.

The density, critical temperature (Tc), critical current density (Jc) measured at the temperature of liquid nitrogen (77K), and carbon content of each of the superconducting moldings of Examples 18 to 20 and Control 15 were measured. The results were as shown in Table 11.

TABLE 11

| | Density (%) | Tc (K) | Jc (A/cm$^2$) at 77K | C Content (wt %) |
|---|---|---|---|---|
| Example 18 | 97 | 93 | $7.1 \times 10^3$ | 0.05 |
| Example 19 | 96 | 92 | $6.5 \times 10^3$ | 0.06 |
| Example 20 | 97 | 93 | $7.8 \times 10^3$ | 0.01 |

TABLE 11-continued

| | Density (%) | Tc (K) | Jc (A/cm$^2$) at 77K | C Content (wt %) |
|---|---|---|---|---|
| Control 15 | 90 | 91 | $1.4 \times 10^2$ | 0.25 |

As is evident from Table 11, the moldings of Examples 18 to 20 had a carbon content of 0.1 wt % or less and were dense moldings having a density of 95% or more of the theoretical value, and exhibited good superconducting characteristics such as Tc and Jc. In contrast, the molding of Control 15 made from the mixture powder, which had not been preburnt in a reducing atmosphere, had a great carbon content, a relatively low density, and insufficient superconducting characteristics such as Tc and Jc.

EXAMPLE 21 AND CONTROLS 16-17

Ba(NO$_3$)$_2$, Y(NO$_3$)$_3$, Cu(NO$_3$)$_2$ were used as material compounds. The compounds were mixed, thus forming mixture powder, in atomic ratio of Y:Ba:Cu=1:2:3. Six portions of this mixture powder, each weighing 500 g, were pre-heated for dehydration at 300° C. for 3 hours in the atmosphere, and then preburnt in a hydrogen-substituted atmosphere evacuated to a hydrogen partial pressure of 10 Torr, at different temperatures specified in Table 12. These preburnt materials were molded, sintered, burnt, and cooled, under the same conditions as in Example 18, thus forming superconducting moldings. The preburning was continued for 10 hours at 350° C. and 450° C.; for 5 hours at 600° C. and 700° C.; for 3 hours at 800° C.~1050° C.

The density, critical temperature (Tc), critical current density (Jc) measured at the temperature of liquid nitrogen (77K), and carbon content of each of the superconducting moldings of Examples 21-1 to 21-6, and Controls 16 and 17 were measured. The results were as shown in Table 12.

TABLE 12

| | Temp. (°C.) | Density (%) | Tc (K) | Jc (A/cm$^2$) at 77K | C Content (wt %) |
|---|---|---|---|---|---|
| Example 21-1 | 450 | 95 | 85 | $4.7 \times 10^3$ | 0.02 |
| Example 21-2 | 600 | 96 | 92 | $6.5 \times 10^3$ | 0.02 |
| Example 21-3 | 700 | 97 | 94 | $7.2 \times 10^3$ | 0.02 |
| Example 21-4 | 800 | 97 | 94 | $9.1 \times 10^3$ | 0.01 |
| Example 21-5 | 900 | 98 | 94 | $9.5 \times 10^3$ | 0.01 |
| Example 21-6 | 950 | 97 | 93 | $9.1 \times 10^3$ | 0.01 |
| Control 16 | 350 | 85 | 83 | $1.5 \times 10^3$ | 0.03 |
| Control 17 | 1050 | 90 | 81 | $2.2 \times 10^3$ | 0.01 |

As is clearly understood from Table 12, the moldings of Examples 21-1 to 21-6 had a carbon content of 0.1 wt % or less and were dense moldings having a density of 95% or more of the theoretical value, and exhibited good superconducting characteristics such as Tc and Jc. In contrast, the moldings of Controls 16 and 17 made from the mixture powder, which had not been preburnt at temperatures falling outside the range according to this invention, had a relatively low density and insufficient superconducting characteristics such as Tc and Jc.

EXAMPLE 22 AND CONTROL 18

Seven portions of the same mixture powder obtained and used in Example 21, each weighing 500 g, were preheated for dehydration under the same conditions as in Example 21. These portions were then preburnt at 800° C. for 3 hours in different hydrogen-substituted atmospheres evacuated to the various hydrogen partial pressures specified in Table 13 and ranging from 0.05 to 760 Torr. These preburnt materials were molded, sintered, burnt, and cooled, under the same conditions as in Example 18, thus forming superconducting moldings.

The density, critical temperature (Tc), critical current density (Jc) measured at the temperature of liquid nitrogen (77K), and carbon content of each of the superconducting moldings of Examples 22-1 to 22-7, and Control 18, were measured. The results were as shown in Table 13.

TABLE 13

| | Hydrogen partial pressure (Torr) | Density (%) | Tc (K) | Jc (A/cm$^2$) at 77K | C Content (wt %) |
|---|---|---|---|---|---|
| Example 22-1 | 0.1 | 95 | 91 | $3.5 \times 10^3$ | 0.03 |
| Example 22-2 | 0.2 | 96 | 92 | $5.2 \times 10^3$ | 0.02 |
| Example 22-3 | 1.0 | 97 | 93 | $6.5 \times 10^3$ | 0.02 |
| Example 22-4 | 5.0 | 97 | 93 | $7.8 \times 10^3$ | 0.02 |
| Example 22-5 | 10.0 | 98 | 95 | $9.1 \times 10^3$ | 0.01 |
| Example 22-6 | 150.0 | 98 | 95 | $9.2 \times 10^3$ | 0.01 |
| Example 22-7 | 760.0 | 98 | 95 | $9.2 \times 10^3$ | 0.01 |
| Control 18 | 0.05 | 91 | 85 | $1.3 \times 10^3$ | 0.04 |

As is evident from Table 13, the moldings of Examples 22-1 to 22-7 had a carbon content of 0.1 wt % or less and a high density of 95% or more, and exhibited good superconducting characteristics such as Tc and Jc. Also as is apparent from Table 13, the higher the hydrogen partial pressure, the better the superconducting characteristics. This is because the less the residual carbon content in the composite oxide powder, the greater the deficiency of oxygen, and hence, the more prominent the activation of composite oxide powder. In contrast, the molding of Control 18, made from the mixture powder which had not been preburnt in the atmospheres having the hydrogen partial pressures lower than those which fall within the range in this invention, had a high carbon content, a relatively low density, and insufficient superconducting characteristics such as Tc and Jc.

EXAMPLE 23 AND CONTROL 19

Six portions of the same mixture powder as used in Example 22, weighing 500 g, were preburnt in CO-substituted atmospheres evacuated to the different CO partial pressures specified in Table 14 and ranging from 0.05 to 150 Torr. The preburnt materials were molded, sintered, burnt and cooled under the same conditions as in Example 22, thereby forming superconducting moldings.

The density, critical temperature (Tc), critical current density (Jc) measured at the temperature of liquid nitrogen (77K), and carbon content of each of the superconducting moldings of Examples 23-1 to 23-6, and Control 19, were measured. The results were as shown in Table 14.

TABLE 14

| | CO partial pressure (Torr) | Density (%) | Tc (K) | Jc (A/cm$^2$) at 77K | C Content (wt %) |
|---|---|---|---|---|---|
| Example 23-1 | 0.1 | 95 | 91 | $4.2 \times 10^3$ | 0.03 |
| Example 23-2 | 0.2 | 96 | 92 | $5.6 \times 10^3$ | 0.02 |
| Example 23-3 | 1.0 | 97 | 93 | $6.6 \times 10^3$ | 0.02 |
| Example 23-4 | 5.0 | 97 | 93 | $8.2 \times 10^3$ | 0.02 |
| Example 23-5 | 10.0 | 98 | 94 | $9.1 \times 10^3$ | 0.02 |
| Example 23-6 | 150.0 | 98 | 95 | $9.2 \times 10^3$ | 0.02 |

TABLE 14-continued

|  | CO partial pressure (Torr) | Density (%) | Tc (K) | Jc (A/cm$^2$) at 77K | C Content (wt %) |
| --- | --- | --- | --- | --- | --- |
| Control 19 | 0.05 | 92 | 85 | $1.5 \times 10^3$ | 0.04 |

As is clearly understood from Table 14, the moldings of Examples 23-1 to 23-6 had a high density and exhibited good superconducting characteristics such as Tc and Jc. In contrast, the molding of Control 19 made from the mixture powder, which had not been preburnt in a CO-substituted atmosphere evacuated to a CO partial pressure lower than the range in this invention, had a relatively low density and insufficient superconducting characteristics such as Tc and Jc.

EXAMPLE 24 AND CONTROL 20

$Bi_2O_3$, $SrCO_3$, $CaCO_3$, and CuO were used as material compounds. These compounds were mixed, thus forming mixture powder, in atomic ratio of Bi:(Sr+Ca):Cu=2:4:3. The mixture powder was preburnt, thus forming a preburnt mass. The mass was preburnt in a furnace for the various periods of time, under the various oxygen partial pressures and at the various temperatures, all specified in Table 15, thereby forming preburnt masses of material. These masses were crushed into powders, which were classified. The powders were press-molded into pellets having a diameter of 25 mm and a thickness of 4 mm. The pellets were sintered for the various periods of time, under the different oxygen partial pressures and at the different temperatures, all specified in Table 15. The sintered pellets were heated in the furnace at 870° C. for 100 hours under the different oxygen partial pressures specified in Table 15. The pellets were then cooled at the rate of 1° C./min, thereby forming oxide superconductor pellets.

The oxygen partial pressure within the furnace were changed and adjusted by means of oxygen substitution and the subsequent pressure reduction in the preburning, sintering and heating.

The relative density, critical temperature (Tc), and critical current density (Jc) of each of the superconducting moldings of Example 24 (Nos. 1~6), and Control 20 (Nos. 7~16), were measured. The results were as shown in Table 15.

and better superconducting characteristics, i.e., Tc and Jc, than the moldings of Control 20 (Nos. 7~16).

Of the control, Nos. 7 and 8 both, which had been made by sintering the pellets under a high oxygen partial pressure, and No. 11, which had been made by sintering the pellet at a low temperature, had low Tc and Jc due to the excess of 85K phase and the insufficient degree of sintering. On the other hand, No. 9, which had been by sintering the pellet under a low oxygen partial pressure, had neither the composition nor the structure required for itself to be superconductive, by lacking of oxygen content. No. 10, which had been made by sintering the pellet at a high temperature, had neither the composition nor the structure required for itself to be superconductive, due to the fusion of crystal boundaries. Thus, both Nos. 9 and 10 had low Jc.

Further, Nos. 12~16, all made from the powder preburnt under the conditions falling outside the heating condition according to the present invention, had low Jc.

EXAMPLE 25

$Bi_2O_3$, $SrCO_3$, $CaCO_3$, and CuO were used as material compounds, each being powder having an average particle diameter of 1 μm or less. The compounds were uniformly mixed in mol ratio of Bi:Sr:Ca:Cu=1:1:1:2, thus forming mixture powder. The mixture powder was molded into rings having an outer diameter of 50 mm, an inner diameter of 30 mm and a thickness of 7 mm, and also into pellets having a diameter of 25 mm and a thickness of 5 mm. These rings and pellets were sintered at 800° C. for 6 hours in an oxygen-substituted atmosphere evacuated to an oxygen partial pressure of $6 \times 10^{-3}$ Torr. The sintered moldings were burnt at 875° C. for 10 hours in an oxygen atmosphere. They were gradually cooled from 850° C. to 300° C. at the rate of 2° C./min, thereby forming superconducting moldings.

EXAMPLE 26

The same mixture powder obtained and used in Example 25 was molded into 5-turn coils having an outer diameter of 50 mm and formed of a wire having a diameter of 2 mm, and also into pipes having an outer diameter of 10 mm, an inner diameter of 8 mm, and a length of 100 mm. The coils and the pipes were sintered, burnt,

TABLE 15

|  |  | Preburning | | | Sintering | | | Heating | Relative Density (%) | Tc (K) | Jc (A/cm$^2$) |
| --- | --- | --- | --- | --- | --- | --- | --- | --- | --- | --- | --- |
|  |  | O$_2$ Partial Pressure (Torr) | Temp. (°C.) | Time (H) | O$_2$ Partial Pressure (Torr) | Temp. (°C.) | Time (H) | O$_2$ Partial Pressure (Torr) | | | |
| Example 24 | 1 | $8 \times 10^{-3}$ | 800 | 16 | 10 | 870 | 100 | 800 | 97.5 | 114 | $8.7 \times 10^3$ |
|  | 2 | " | " | " | 1 | " | " | " | 97.4 | " | $9.2 \times 10^3$ |
|  | 3 | " | " | " | $5 \times 10^{-2}$ | " | " | " | 97.1 | 112 | $9.0 \times 10^3$ |
|  | 4 | " | " | " | 15 | 875 | 20 | " | 97.2 | " | $8.9 \times 10^3$ |
|  | 5 | " | " | " | $5 \times 10^{-1}$ | 750 | 100 | " | 96.6 | " | $8.2 \times 10^3$ |
|  | 6 | " | " | " | 10 | 860 | 100 | 30 | 97.3 | " | $8.5 \times 10^3$ |
| Control 20 | 7 | " | " | " | 200 | 865 | 100 | 100 | 96.1 | 110 | $7.3 \times 10^2$ |
|  | 8 | " | " | " | 30 | " | " | " | 96.4 | 110 | $1.2 \times 10^3$ |
|  | 9 | " | " | " | $3 \times 10^{-3}$ | " | " | " | 97.1 | 106 | $6.7 \times 10^2$ |
|  | 10 | " | " | " | 10 | 1,000 | 6 | " | 96.2 | 100 | $2.3 \times 10^2$ |
|  | 11 | " | " | " | " | 680 | 100 | " | 83.9 | 106 | $1.5 \times 10^2$ |
|  | 12 | $10^{-6}$ | " | " | 10 | 850 | 100 | " | 97.2 | 110 | $5.4 \times 10^2$ |
|  | 13 | 30 | " | " | " | " | " | " | 96.3 | 110 | $7.1 \times 10^2$ |
|  | 14 | $8 \times 10^{-3}$ | 450 | 100 | " | " | " | " | 95.2 | 83 | $3.5 \times 10^2$ |
|  | 15 | " | 1,030 | 6 | " | " | " | " | 97.0 | 85 | $4.1 \times 10^2$ |
|  | 16 | " | 900 | 16 | " | " | " | 15 | 97.4 | 110 | $1.2 \times 10^2$ |

As is clearly seen from Table 15, the moldings of Example 24 (Nos. 1~6) had a higher relative density and cooled, under the same conditions as in Example 25, thus forming superconducting moldings.

Control 21

The same mixture powder as obtained and used in Example 25 was molded into rings and pellets, both having the same sizes as those made in Example 25. These moldings were sintered in the ordinary atmosphere at 875° C. for 2 hours, and were then burnt also in the ordinary atmosphere at 865° C. for 10 hours. The burnt moldings were gradually cooled from 850° C. to 300° C. at the rate of 1° C./min, thereby forming superconducting moldings.

The density, critical temperature (Tc), and critical current density (Jc) of each of the superconducting moldings of Examples 25 and 26, and Control 21, were measured. The results were as shown in Table 16.

TABLE 16

|  | Shape of Moldings | Density (%) | Tc (K) | Jc (A/cm$^2$) |
| --- | --- | --- | --- | --- |
| Example 25 | Pellet | 96 | 114 | $7.2 \times 10^3$ |
|  | Ring | 97 | 114 | $7.0 \times 10^3$ |
| Example 26 | Coil | 96 | 112 | $6.9 \times 10^3$ |
|  | Pipe | 97 | 112 | $6.6 \times 10^3$ |
| Control 21 | Pellet | 93 | 85 | $1.2 \times 10^2$ |
|  | Ring | 92 | 83 | $1.4 \times 10^2$ |

EXAMPLE 27

$Bi_2O_3$, $Sr(NO_3)_2$, $Ca(NO_3)_2$ and CuO were used as material compounds, each being powder having an average particle diameter of 1 μm or less. The compounds were uniformly mixed in mol ratio of Bi:Sr:Ca:Cu=2:2:2:3, thus forming mixture powder. The mixture powder was molded into rings having an outer diameter of 50 mm, an inner diameter of 30 mm and a thickness of 7 mm, and also into pellets having a diameter of 25 mm and a thickness of 5 mm. These rings and pellets were sintered at 800° C. for 6 hours in an oxygen-substituted atmosphere evacuated to an oxygen partial pressure of $6 \times 10^{-3}$ Torr. The sintered moldings were burnt at 875° C. for 6 hours in an atmosphere and further at 800° C. for 10 hours in an oxygen atmosphere. They were gradually cooled from 800° C. to 300° C. at the rate of 1° C./min, thereby forming superconducting moldings.

EXAMPLE 28

$Tl_2O_3$, $BaCO_3$, $CaCO_3$, and CuO were used as material compounds. The compounds were homogeneously mixed in mol ratio of Tl:Ba:Ca:Cu=2:2:2:3, thus forming mixture powder. The mixture powder was molded into 5-turn coil having an outer diameter of 50 mm and formed of a wire having a diameter of 2 mm, and also into pipes having an outer diameter of 10 mm, an inner diameter of 8 mm, and a length of 100 mm. The coils and the pipes were sintered, burnt, and cooled, under the same conditions as in Example 25, thus forming superconducting moldings.

The density, critical temperature (Tc), and critical current density (Jc) of each of the superconducting moldings of Examples 27 and 28 were measured. The results were as shown in Table 17.

TABLE 17

|  | Shape of Moldings | Density (%) | Tc (K) | Jc (A/cm$^2$) |
| --- | --- | --- | --- | --- |
| Example 27 | Pellet | 98 | 110 | $7.5 \times 10^3$ |
|  | Ring | 98 | 110 | $7.3 \times 10^3$ |

TABLE 17-continued

|  | Shape of Moldings | Density (%) | Tc (K) | Jc (A/cm$^2$) |
| --- | --- | --- | --- | --- |
| Example 28 | Coil | 98 | 120 | $8.0 \times 10^3$ |
|  | Pipe | 98 | 120 | $8.2 \times 10^3$ |

As Tables 16 and 17 clearly show, the moldings of Examples 25 to 28 were dense moldings having a density of 95% or more of the theoretical value, and also exhibited sufficient superconducting characteristics such as Tc and Jc. In contrast, the molding of Control 21, which had been made from the material powder not preburnt in an atmosphere having a low oxygen partial pressure, had a low density and exhibited insufficient superconducting characteristics such as Tc and Jc.

EXAMPLE 29

$Bi_2O_3$, $SrCO_3$, $CaCO_3$, and CuO were used as material compounds. The compounds were uniformly mixed in mol ratio of Bi:Sr:Ca:Cu=1:1:1:2, thus forming mixture powder. Five hundred (500) grams of the resultant mixture was preburnt at 800° C. for 5 hours in an oxygen-substituted atmosphere evacuated to an oxygen partial pressure of $2 \times 10^{-2}$ Torr, thus forming a preburnt mass. This mass was crushed into powders. The powders were classified, and those powders having an average particle diameter of 2 μm or less was molded into rings having an outer diameter of 50 mm, an inner diameter of 30 mm and a thickness of 7 mm, and also into pellets having a diameter of 25 mm and a thickness of 5 mm. These rings and pellets were sintered at 870° C. for 10 hours in a nitrogen-oxygen atmosphere ($N_2:O_2=4:1$). These moldings were then burnt at 800° C. for 6 hours in an oxygen atmosphere. They were gradually cooled from 800° C. to 400° C. at the rate of 1° C./min, thereby forming superconducting moldings.

EXAMPLE 30

The same preburnt mixture powder obtained and used in Example 29 was molded into 5-turn coils having an outer diameter of 50 mm and formed of a wire having a diameter of 2 mm, and also into pipes having an outer diameter of 10 mm, an inner diameter of 8 mm, and a length of 100 mm. The coils and the pipes were first sintered at 880° C. for 8 hours in an oxygen atmosphere. The coils and rings, thus sintered, were burnt at 700° C. for 20 hours in an oxygen atmosphere. These moldings were gradually cooled from 700° C. to 300° C. at the rate of 1° C./min, thus forming superconducting moldings having no cracks.

EXAMPLE 31

$Tl_2O_3$, $Ba(NO_3)_2$, $Ca(NO_3)_2$ and $Cu(NO_3)_2$ were used as material compounds. These compounds were mixed in mol ratio of Tl:Bi:Ca:Cu=2:2:2:3, thus preparing mixture powder. Five hundred (500) grams of the mixture powder was preburnt at 780° C. for 7 hours in an oxygen-substituted atmosphere evacuated to an oxygen partial pressure of 10 Torr, thereby forming a preburnt mass. This preburnt mass was molded, sintered, burnt, and cooled, under the same conditions as in Example 29, thereby forming superconducting moldings

Control 22

The same mixture powder as obtained and used in Example 29 was preburnt at 870° C. for 10 hours in the ordinary atmosphere, thus forming a preburnt mass.

This preburnt mass was molded, sintered, burnt, and cooled, under the same conditions as in Example 29, thereby forming superconducting moldings.

The density, critical temperature (Tc), and critical current density (Jc) of each of the superconducting moldings of Examples 29, 30, and 31, and of Control 22, were measured. The results were as shown in Table 18.

TABLE 18

|  | Shape of Moldings | Density (%) | Tc (K) | Jc (A/cm$^2$) |
| --- | --- | --- | --- | --- |
| Example 29 | Pellet | 97 | 114 | $7.2 \times 10^3$ |
|  | Ring | 96 | 113 | $6.9 \times 10^3$ |
| Example 30 | Coil | 96 | 110 | $7.0 \times 10^3$ |
|  | Pipe | 95 | 110 | $7.1 \times 10^3$ |
| Example 31 | Pellet | 95 | 120 | $8.6 \times 10^3$ |
|  | Ring | 96 | 122 | $8.8 \times 10^3$ |
| Control 22 | Pellet | 90 | 85 | $1.3 \times 10^2$ |
|  | Ring | 87 | 83 | $1.4 \times 10^2$ |

As is evident from Table 18, the moldings of Examples 29, 30 and 31 were dense moldings having a density of 95% or more of the theoretical value, and also exhibited sufficient superconducting characteristics such as Tc and Jc. In contrast, the molding of Control 22, which had been made from the material powder not preburnt in an atmosphere having a low oxygen partial pressure, had a low density and exhibited insufficient superconduction characteristics such as Tc and Jc.

EXAMPLE 32

$Bi_2O_3$, $SrCO_3$, $CaCO_3$, and CuO were used as material compounds. These compounds were mixed in atomic ratio of Bi:Sr:Ca:Cu=1:1:1:2. Five hundred (500) grams of the resultant mixture was preburnt at 800° C. for 4 hours in an oxygen-substituted atmosphere evacuated to an oxygen partial pressure of $2 \times 10^{-2}$ Torr, thus forming a preburnt mass. This preburnt mass was crushed into powders, which were classified. Those powders having an average particle diameter of 2 μm or less were molded into pellets having a diameter of 25 mm and a thickness of 5 mm. These pellets were sintered in the ordinary atmosphere at 870° C. for 2 hours. The sintered pellets were gradually cooled at the rate of 1° C./min, thereby forming superconducting moldings.

EXAMPLE 33

The same preburnt mixture powder as prepared and used in Example 32 was molded into 5-turn coils having an outer diameter of 50 mm and formed of a wire having a diameter of 2 mm, and also into pipes having an outer diameter of 10 mm, an inner diameter of 8 mm, and a length of 100 mm. These moldings were sintered in the ordinary atmosphere at 870° C. for 2 hours. The sintered moldings were gradually cooled at the rate of 1° C./min, thus forming superconducting moldings having no cracks.

EXAMPLE 34

$Ba(NO_3)_2$, $Ca(NO_3)_2$, $Tl(NO_3)_3$, and $Cu(NO_3)_2$ were used as material compounds. These compounds were mixed in atomic ratio of Tl:Ba:Ca:Cu=2:2:2:3, thus preparing a mixture powder. Five hundred (500) grams of the mixture powder was preburnt at 810° C. for 7 hours in an oxygen-substituted atmosphere evacuated to an oxygen partial pressure of 10 Torr, thereby forming a preburnt mass. This preburnt mass was molded into pellets under the same sizes as those made in Example 32. These moldings were sintered at 880° C. for 3 hours. The sintered moldings were gradually cooled at the rate of 1° C./min, thereby forming superconducting moldings.

Control 23

The same mixture powder as used in Example 32 was preburnt at 800° C. for 8 hours in an oxygen-substituted atmosphere which had been evacuated to an oxygen partial pressure of 0.6 atm (the remaining partial pressure being of nitrogen; the total pressure being 1 atm). The preburnt material was molded into moldings of the same shape and size as those prepared in Example 32. These moldings were sintered in the ordinary atmosphere under the same conditions as in Example 32. The sintered moldings were gradually cooled, thus forming superconducting moldings.

The density, critical temperature (Tc), critical current density (Jc) measured at the temperature of liquid nitrogen (77K), and carbon content of each of the superconducting moldings of Examples 32, 33, and 34, and of Control 23, were measured. The results were as shown in Table 19.

TABLE 19

|  | Shape of Moldings | Density (%) | Tc (K) | Jc at 77K (A/cm$^2$) | C Content (wt %) |
| --- | --- | --- | --- | --- | --- |
| Example 32 | Pellet | 97 | 115 | $6.5 \times 10^3$ | 0.05 |
| Example 33 | Coil | 96 | 110 | $5.1 \times 10^3$ | 0.06 |
|  | Pipe | 95 | 110 | $5.7 \times 10^3$ | 0.06 |
| Example 34 | Pellet | 95 | 125 | $9.9 \times 10^3$ | 0.01 |
| Control 23 | Pellet | 90 | 85 | $1.3 \times 10^2$ | 0.25 |

As is evident from Table 19, the moldings of Examples 32, 33 and 34 had a carbon content of 0.1 wt % or less and were dense moldings having a density of 95% or more of the theoretical value, and also exhibited sufficient superconducting characteristics such as Tc and Jc since they contained a 100K-class, high-Tc and uniform phase. In contrast, the molding of Control 23, which had been made from the mixture powder not preburnt in an atmosphere having a low oxygen partial pressure, had a high carbon content and a low density, and exhibited insufficient superconducting properties such as Tc and Jc since it contained both an 85K-class Tc phase and a 100K-class Tc phase.

EXAMPLE 35 AND CONTROLS 24–25

Aqueous solutions of $Ba(NO_3)_2$, $Ca(NO_3)_2$, $Tl(NO_3)_3$, $Cu(NO_3)_2$ were mixed in atomic ratio of Tl:Ba:Ca:Cu=2:2:2:3. Oxalic acid is applied to the mixture of the solutions, thus causing the co-precipitation. These co-precipitated mass were dehydrated and dried, thus forming material powder. Five portions of this powder, each weighing 500 g, were pre-heated for dehydration at 300° C. for 3 hours in the atmosphere. These portions of the pre-heated powder were preburnt in a heating furnace which had been evacuated to about 0.5 Torr, at the various temperatures specified in Table 20. The preburnt powder was molded, sintered and cooled in the same way and under the same conditions, as in Example 32, thus forming superconducting moldings. The preburning was continued for 6 hours at 450° C.~650° C.; for 3 hours at 750° C.~1000° C.

The density, critical temperature (Tc), critical current density (Jc) measured at liquid nitrogen temperature (77K), and carbon content, of each of the superconducting moldings of Examples 35-1 to 35-5 and Controls 24 and 25, were measured. The results were as shown in Table 20.

TABLE 20

| | Temp. (°C.) | Density (%) | Tc (K) | Jc at 77K (A/cm$^2$) | C Content (wt %) |
|---|---|---|---|---|---|
| Example 35-1 | 550 | 97 | 118 | 7.1 × 10$^3$ | 0.02 |
| Example 35-2 | 650 | 98 | 120 | 9.2 × 10$^3$ | 0.02 |
| Example 35-3 | 750 | 98 | 120 | 9.5 × 10$^3$ | 0.02 |
| Example 35-4 | 850 | 97 | 125 | 9.9 × 10$^3$ | 0.02 |
| Example 35-5 | 900 | 95 | 120 | 8.5 × 10$^3$ | 0.02 |
| Control 24 | 450 | 89 | 85 | 5.5 × 10$^2$ | 0.03 |
| Control 25 | 1050 | 90 | 81 | 2.2 × 10$^2$ | 0.02 |

As can be clearly understood from Table 20, the moldings of Examples 35-1 to 35-5 had a carbon content of 0.1 wt % or less and were dense moldings having a density of 95% or more of the theoretical value, and also exhibited sufficient superconducting properties such as Tc and Jc. In contrast, the moldings of Controls 24 and 25, which had been made from the material powder not preburnt at temperatures falling outside the range according to this invention, had a low density and no sufficiently uniform phase, and, therefore, exhibited insufficient superconducting properties such as Tc and Jc.

EXAMPLE 36 AND CONTROLS 26-27

Six portions of the same material powder obtained and used in Example 35, each weighing 500 g, were preburnt at 750° C. for 3 hours, in oxygen-substituted atmospheres evacuated to oxygen partial pressures ranging from 1×10$^{-3}$ Torr to 150 Torr as shown in Table 21. The preburnt powder was molded into pellets, and these pellets were sintered and cooled under the same conditions as in Example 32, thereby forming superconducting moldings.

The density, superconducting properties, and carbon content of each of the superconducting moldings of Examples 36-1 to 36-6 and Controls 26 and 27, were measured. The results were as shown in Table 21.

TABLE 21

| | O$_2$ Partial pressure (Torr) | Density (%) | Tc (K) | Jc at 77K (A/cm$^2$) | C Content (wt %) |
|---|---|---|---|---|---|
| Example 36-1 | 1 × 10$^{-3}$ | 98.5 | 125 | 9.9 × 10$^3$ | 0.005 |
| Example 36-2 | 1 × 10$^{-2}$ | 98 | 120 | 9.7 × 10$^3$ | 0.01 |
| Example 36-3 | 1 × 10$^{-1}$ | 98 | 120 | 9.5 × 10$^3$ | 0.02 |
| Example 36-4 | 1 | 97.5 | 115 | 9.3 × 10$^3$ | 0.02 |
| Example 36-5 | 10 | 97 | 110 | 6.2 × 10$^3$ | 0.03 |
| Example 36-6 | 40 | 96 | 105 | 2.2 × 10$^3$ | 0.05 |
| Control 26 | 75 | 93 | 89 | 5.3 × 10$^2$ | 0.15 |
| Control 27 | 150 | 90 | 85 | 1.5 × 10$^2$ | 0.3 |

As is evident from Table 21, the moldings of Examples 36-1 to 36-6 was of a uniform high-Tc phase, a low carbon content of 0.1 wt % or less, and a high density. Hence, they had excellent superconducting properties such as Tc and Jc. As is clear from Table 21, the lower the oxygen partial pressure, the better the superconducting properties. This is because the lower the residual carbon content in the secondary material powder, the greater the deficiency of oxygen, and thus, the more prominent the activation of the powder. In contrast, the moldings of Controls 26 and 27, which had been made from the powder preburnt in the atmospheres having oxygen partial pressures higher than the range in the present invention, had a carbon content over 0.1 wt % and a low density. Further, since they were in a low-Tc phase, they had insufficient superconducting properties such as Tc and Jc.

EXAMPLE 37

Bi$_2$O$_3$, SrCO$_3$, CaCO$_3$ and CuO were used as material compounds. These compounds were mixed in atomic ratio of Bi:Sr:Ca:Cu=1:1:1:2. Five hundred (500) grams of the resultant mixture was preburnt at 800° C. for 4 hours in an hydrogen-substituted reducing atmosphere evacuated to a hydrogen partial pressure of 10 Torr, thus forming a preburnt mass. This preburnt mass was crushed into powders, which were classified. Those powders having an average particle diameter of 2 μm or less were molded into pellets having a diameter of 25 mm and a thickness of 5 mm. These pellets were sintered in the ordinary atmosphere at 870° C. for 2 hours. The sintered pellets were gradually cooled at the rate of 0.5° C./min, thereby forming superconducting moldings.

EXAMPLE 38

The same primary material powder as used in Example 37 was preburnt at 820° C. for 4 hours in a CO-substituted reducing atmosphere having a CO partial pressure of 1 Torr, thus forming a preburnt mass. This preburnt mass was crushed into powders, which were classified. Those powders having an average particle diameter of 2 μm or less were molded into pellets having a diameter of 25 mm and a thickness of 5 mm. These pellets were sintered and cooled under the same conditions as in Example 37, thereby forming superconducting moldings.

EXAMPLE 39

Ba(NO$_3$)$_2$, Ca(NO$_3$)$_2$, Tl(NO$_3$)$_3$, and Cu(NO$_3$)$_2$ were used as material powders. They were mixed in atomic ratio of Tl:Ba:Ca:Cu=2:2:2:3, thus preparing a mixture. Five (hundred) 500 grams of the mixture was preburnt at 750° C. for 2 hours in an reducing atmosphere evacuated to a hydrogen partial pressure of 10 Torr, thereby forming a preburnt mass. This preburnt mass was molded into pellets of the same sizes as those made in Example 37. The pellets were sintered at 880° C. for 3 hours. The sintered pellets were gradually cooled at the rate of 1° C./min, thereby forming superconducting moldings.

Control 28

The same material powder prepared and used in Example 37 was preburnt at 800° C. for 8 hours in the ordinary atmosphere, thus forming a preburnt mass. This preburnt mass was molded, sintered, and cooled under the same conditions as in Example 37, thereby forming oxide superconducting moldings.

The density, critical temperature (Tc), critical current density (Jc) measured at liquid nitrogen temperature (77K), and carbon content, of each of the superconducting moldings of Examples 37, 38, and 39 and Control 28, were measured. The results were as shown in Table 22.

TABLE 22

| | Density (%) | Tc (K) | Jc (A/cm2) at 77K | C Content (wt %) |
|---|---|---|---|---|
| Example 37 | 97 | 115 | 6.5 × 10$^3$ | 0.05 |
| Example 38 | 96 | 110 | 5.5 × 10$^3$ | 0.06 |
| Example 39 | 97 | 125 | 9.2 × 10$^3$ | 0.01 |

TABLE 22-continued

|  | Density (%) | Tc (K) | Jc (A/cm2) at 77K | C Content (wt %) |
|---|---|---|---|---|
| Control 28 | 90 | 85 | $1.4 \times 10^2$ | 0.25 |

As is evident from Table 22, the moldings of Examples 37, 38 and 39 had a carbon content of 0.1 wt % or less and were dense moldings having a density of 95% or more of the theoretical value. They were of a 100K-class, high-Tc and uniform phase. Therefore, they exhibited sufficient superconducting properties such as Tc and Jc. In contrast, the molding of Control 28, which had been made from the material powder not preburnt in a reducing atmosphere, had a high carbon content and a low density, and exhibited insufficient superconducting properties such as Tc and Jc since it contained both an 85K-class Tc phase and 100K-class Tc phase.

EXAMPLE 40 AND CONTROLS 29-30

Aqueous solutions of $Ba(NO_3)_2$, $Ca(NO_3)_2$, $Tl(NO_3)_2$, and $Cu(NO_3)_2$ were mixed in atomic ratio of Tl:Ba:Ca:Cu=2:2:2:3. Oxalic acid is applied to the mixture of the solutions, thus causing the co-precipitation. These co-precipitated masses were dehydrated and dried, thus forming material powder. Five portions of this powder, each weighing 500 g, were pre-heated for dehydration at 300° C. for 3 hours in the atmosphere. These portions of the powder were preburnt in a hydrogen atmosphere having a hydrogen partial pressure of 10 Torr, at the various temperatures specified in Table 23. The preburnt powder was molded, sintered and cooled in the same way and under the same conditions, as in Example 37, thus forming superconducting moldings. The preburning was continued for 10 hours at 350° C. and 450° C.; for 5 hours at 600° C. and 700° C.; for 3 hours at 800° C.~1000° C.

The density, critical temperature (Tc), critical current density (Jc) measured at liquid nitrogen temperature (77K), and carbon content, of each of the superconducting moldings of Examples 40-1 to 40-5 and Controls 29 and 30, were measured. The results were as is shown in Table 23.

TABLE 23

|  | Temp. (°C.) | Density (%) | Tc (K) | Jc (A/cm²) at 77K | C Content (wt %) |
|---|---|---|---|---|---|
| Example 40-1 | 450 | 95 | 108 | $4.7 \times 10^3$ | 0.02 |
| Example 40-2 | 600 | 96 | 115 | $6.5 \times 10^3$ | 0.02 |
| Example 40-3 | 700 | 97 | 120 | $7.2 \times 10^3$ | 0.02 |
| Example 40-4 | 800 | 97 | 125 | $9.1 \times 10^3$ | 0.01 |
| Example 40-5 | 900 | 98 | 125 | $9.5 \times 10^3$ | 0.01 |
| Control 29 | 350 | 85 | 85 | $1.5 \times 10^2$ | 0.03 |
| Control 30 | 1050 | 90 | 81 | $2.2 \times 10^2$ | 0.01 |

As can be clearly understood from Table 23, the moldings of Examples 40-1 to 40-5 had a carbon content of 0.1 wt % or less and were dense moldings having a density of 95% or more of the theoretical value, and also exhibited sufficient superconducting properties such as Tc and Jc. In contrast, the moldings of Controls 29 and 30, which had been made from the primary material powder not preburnt at temperatures falling outside the range according to this invention, had a low density and no sufficiently uniform phase, and, therefore, exhibited insufficient superconducting properties such as Tc and Jc.

EXAMPLE 41 AND CONTROL 31

Seven portions of the same material powder obtained and used in Example 40, each weighing 500 g, were preburnt at 800° C. for 3 hours, in hydrogen-substituted atmospheres evacuated to hydrogen partial pressures ranging from 0.05 Torr to 760 Torr as shown in Table 24. The preburnt powder was molded into pellets, and these pellets were sintered and cooled under the same conditions as in Example 37, thereby forming superconducting moldings.

The superconducting properties and carbon content of each of the superconducting moldings of Examples 41-1 to 41-7 and Control 31, were measured. The results were as shown in Table 24.

TABLE 24

|  | Hydrogen partial pressure (Torr) | Density (%) | Tc (K) | Jc (A/cm²) at 77K | C Content (wt %) |
|---|---|---|---|---|---|
| Example 41-1 | 0.1 | 95 | 108 | $3.5 \times 10^3$ | 0.03 |
| Example 41-2 | 0.2 | 96 | 110 | $5.2 \times 10^3$ | 0.02 |
| Example 41-3 | 1.0 | 97 | 115 | $6.5 \times 10^3$ | 0.02 |
| Example 41-4 | 5.0 | 97 | 115 | $7.8 \times 10^3$ | 0.02 |
| Example 41-5 | 10.0 | 98 | 120 | $9.1 \times 10^3$ | 0.01 |
| Example 41-6 | 150.0 | 98 | 125 | $9.2 \times 10^3$ | 0.01 |
| Example 41-7 | 760.0 | 98 | 125 | $9.2 \times 10^3$ | 0.01 |
| Control 31 | 0.05 | 91 | 85 | $1.3 \times 10^2$ | 0.04 |

As is evident from Table 24, the moldings of Examples 41-1 to 41-7 was of uniform phase and had a low carbon content of 0.1 wt % or less and a high density. Hence, they had good superconducting properties such as Tc and Jc. As is clear from Table 24, the higher the hydrogen partial pressure, the better the superconducting properties. This is because the lower the residual carbon content in the secondary material powder, the greater the deficiency of oxygen, and thus, the more prominent activation of the powder. In contrast, the molding of Control 31, which had been made from the powder preburnt in the atmospheres having a hydrogen partial pressure lower than the range according to the present invention, had a low density and was of a low-Tc phase. Therefore, they had insufficient superconducting properties such as Tc and Jc.

EXAMPLE 42 AND CONTROL 32

Six portions of the same material powder in Example 41, each weighing 500 g, were preburnt under the same conditions as in Example 41, except that they were preburnt in a CO gas-substituted reducing atmospheres evacuated to CO partial pressures ranging from 0.05 Torr to 150 Torr as shown in Table 25. The preburnt powder was molded, sintered and cooled under the same conditions as in Example 41, thereby forming superconducting moldings.

The superconducting properties and carbon content, of each of the superconducting moldings of Examples 42-1 to 42-6 and Control 32, were measured. The results were as shown in Table 25.

TABLE 25

|  | CO Partial Pressure (Torr) | Density (%) | Tc (K) | Jc (A/cm²) at 77K | C Content (wt %) |
|---|---|---|---|---|---|
| Example 42-1 | 0.1 | 95 | 108 | $4.2 \times 10^3$ | 0.03 |
| Example 42-2 | 0.2 | 96 | 110 | $5.6 \times 10^3$ | 0.02 |
| Example 42-3 | 1.0 | 97 | 115 | $6.6 \times 10^3$ | 0.02 |
| Example 42-4 | 5.0 | 97 | 115 | $8.2 \times 10^3$ | 0.02 |

TABLE 25-continued

| | CO Partial Pressure (Torr) | Density (%) | Tc (K) | Jc (A/cm$^2$) at 77K | C Content (wt %) |
|---|---|---|---|---|---|
| Example 42-5 | 10.0 | 98 | 120 | 9.1 × 10$^3$ | 0.02 |
| Example 42-6 | 150.0 | 98 | 125 | 9.2 × 10$^3$ | 0.02 |
| Control 32 | 0.05 | 92 | 85 | 1.5 × 10$^2$ | 0.04 |

As is evident from Table 25, the moldings of Examples 42-1 to 42-6, were of a uniform phase and a high density. Hence, they had excellent superconducting properties such as Tc and Jc. In contrast, the molding of Control 32, which had been made from the powder preburnt in a CO atmosphere having a CO partial pressure lower than the range according to this invention, had a low density and was of a low-Tc phase. Therefore, they had insufficient superconducting properties such as Tc and Jc.

As has been described, the method according to the present invention makes it possible to manufacture an oxide superconductor which is dense, contains a small amount of carbon residue, and exhibits excellent superconducting properties. Further, the method according to this invention makes it possible to provide an active, composite oxide powder which contains a small amount of carbon residue and a deficient amount of oxygen. An oxide superconductor made from this composite oxide powder exhibits excellent superconducting properties. The present invention is, therefore, very useful from an industrial point of view.

What is claimed is:

1. A method of manufacturing an oxide superconductor containing at least an alkaline earth metal and copper, said method comprising the steps of:
    first heating a material substance containing elements constituting the oxide superconductor, in an oxygen-containing atmosphere having an oxygen partial pressure of at most 50 Torr at a temperature of 500° C. to 1000° C., thereby preparing a precursor of the oxide superconductor and then
    heating the precursor in an oxygen-containing atmosphere under an oxygen partial pressure of at least 50 Torr, thereby preparing the oxide superconductor; and
    wherein said first heating of the material substance at a temperature of 500° C. to 1000° C. is accomplished in a reducing atmosphere at a total pressure of 0.5 atm or less and containing a reducing gas selected from the group consisting of hydrogen and carbon monoxide, to decrease the carbon content to 0.1 wt % or less.

2. The method according to claim 1, wherein said material substance is at least one member selected from the group consisting of: oxide, hydroxide, halogenide, carbonate, nitrate, acetate, oxalate and alkoxide of said elements; and superconductor formed by means of burning performed in the ordinary atmosphere or an oxygen atmosphere.

3. The method according to claim 1, wherein said material substance is powder prepared by simultaneously precipitating salt solutions containing the elements constituting the oxide superconductor, by means of co-precipitation.

4. The method according to claim 1, wherein said oxide superconductor is one selected from the group consisting of ReBa$_2$Cu$_3$O$_{7-x}$, (Re$_{1-x}$Re$_x$)Ba$_2$Cu$_3$O$_{7-x}$, Bi-Sr-Ca-Cu$_2$-O$_x$, and Tl$_2$-Ba$_2$-Ca$_2$-Cu$_3$-Ox (Re is a rare earth element other than La).

5. The method according to claim 1, wherein said oxide superconductor is powder.

6. The method according to claim 1, wherein said oxide superconductor is a moldings selected from the group consisting of a wire, a strip, a plate, a pellet, a coil, a ring and a pipe.

7. The method according to claim 1, wherein said heating of the material substance at a temperature ranging from 500° C. to 1000° C. is accomplished in said reducing atmosphere containing said reducing gas selected from the group consisting of hydrogen and carbon monoxide having a reducing-gas partial pressure of at least 0.1 Torr.

8. A method of manufacturing composite oxide powder which is the precursor of an oxide superconductor containing at least an alkaline earth metal and copper, said method comprising the steps of:
    heating a material substance containing elements constituting the oxide superconductor, in an oxygen-containing atmosphere having an oxygen partial pressure of at most 50 Torr at a temperature ranging from 500° C. to 1000° C.; and
    crushing the material substance, thereby forming composite oxide powder; and
    wherein said heating of the material substance at a temperature ranging from 500° C. to 1000° C. is accomplished in a reducing atmosphere at a total pressure of 0.5 atm or less and containing a reducing gas selected from the group consisting of hydrogen and carbon monoxide to decrease the carbon content to 0.1 wt % or less.

9. The method according to claim 8, wherein said material substance is at least one member selected from the group consisting of: oxide, hydroxide, halogenide, carbonate, nitrate, acetate, oxalate and alkoxide of said elements; and superconductor formed by means of burning performed in the ordinary atmosphere or an oxygen atmosphere.

10. The method according to claim 8, wherein said material substance is powder prepared by simultaneously precipitating salt solutions containing the elements constituting the oxide superconductor, by mean of co-precipitation.

11. The method according to claim 8, wherein said oxide superconductor is one selected from the group consisting of ReBa$_2$Cu$_3$O$_{7-x}$, (Re$_{1-x}$Re$_x$)Ba$_2$Cu$_3$O$_{7-x}$, Bi-Sr-Ca-Cu$_2$-O$_x$, and Tl$_2$-Ba$_2$-Ca$_2$-Cu$_3$-O$_x$ (Re is a rare earth element other than La).

12. The method according to claim 8, wherein said heating of the material substance at a temperature ranging from 500° C. to 1000° C. is accomplished in said reducing atmosphere containing said reducing gas selected from the group consisting of hydrogen and carbon monoxide having a reducing-gas partial pressure of at least 0.1 Torr.

* * * * *